(12) United States Patent
Ok et al.

(10) Patent No.: US 11,038,064 B2
(45) Date of Patent: Jun. 15, 2021

(54) VERTICAL NANO-WIRE COMPLIMENTARY METAL-OXIDE-SEMICONDUCTOR TRANSISTOR WITH CYLINDRICAL III-V COMPOUND AND GERMANIUM CHANNEL

(71) Applicant: International Business Machines Corporation, Armonk, NY (US)

(72) Inventors: Injo Ok, Loudonville, NY (US); Choonghyun Lee, Rensselaer, NY (US); Soon-Cheon Seo, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/744,566

(22) Filed: Jan. 16, 2020

(65) Prior Publication Data

US 2020/0152798 A1    May 14, 2020

Related U.S. Application Data

(62) Division of application No. 16/009,406, filed on Jun. 15, 2018, now Pat. No. 10,608,114.

(51) Int. Cl.
| | |
|---|---|
| *H01L 29/78* | (2006.01) |
| *H01L 29/786* | (2006.01) |
| *H01L 29/205* | (2006.01) |
| *H01L 29/66* | (2006.01) |
| *H01L 29/16* | (2006.01) |

(52) U.S. Cl.
CPC ........ *H01L 29/78642* (2013.01); *H01L 29/16* (2013.01); *H01L 29/205* (2013.01); *H01L 29/66462* (2013.01); *H01L 29/66666* (2013.01)

(58) Field of Classification Search
None
See application file for complete search history.

(56) References Cited

U.S. PATENT DOCUMENTS

| | | | |
|---|---|---|---|
| 7,230,286 | B2 | 6/2007 | Cohen et al. |
| 8,932,940 | B2 | 1/2015 | Wang et al. |
| 8,969,145 | B2 | 3/2015 | Chang et al. |
| 9,209,271 | B1 | 12/2015 | Lee et al. |

(Continued)

OTHER PUBLICATIONS

K. Komioka et al., "A III-V nanowire channel on silicon for high-performance vertical transistors", vol. 488 Aug. 9, 2012.

(Continued)

*Primary Examiner* — Benjamin P Sandvik
(74) *Attorney, Agent, or Firm* — Fleit Intellectual Property Law; Thomas S. Grzesik

(57) ABSTRACT

A semiconductor structure and a method for fabricating the same. The semiconductor structure includes a substrate and a first source/drain layer in contact with at least the substrate. A vertical channel including indium gallium arsenide or germanium contacts at least the first/source drain layer. A gate structure contacts at least the vertical channel. A second source/drain layer contacts at least inner sidewalls of the vertical channel. The method includes epitaxially growing one or more fin structures comprising gallium arsenide in contact with a portion of a substrate. A separate channel layer comprising indium gallium arsenide or germanium is formed in contact with a respective one of the one or more fin structures.

19 Claims, 20 Drawing Sheets

(56) References Cited

U.S. PATENT DOCUMENTS

| | | |
|---|---|---|
| 9,443,982 B1 | 9/2016 | Balakrishnan et al. |
| 9,647,112 B1 * | 5/2017 | Balakrishnan et al. |
| 9,954,102 B1 * | 4/2018 | Mochizuki .......... H01L 29/6653 |
| 10,276,659 B2 | 4/2019 | Xie et al. |
| 2014/0042524 A1 | 2/2014 | Chuang et al. |
| 2017/0133488 A1 * | 5/2017 | Xiao .................. H01L 29/7802 |
| 2017/0365526 A1 | 12/2017 | Jeong et al. |
| 2018/0005904 A1 | 1/2018 | Lee et al. |
| 2018/0082901 A1 | 3/2018 | Kunert et al. |

OTHER PUBLICATIONS

K. Tomioka et al., "Control of InAs Nanowire Growth Directions on Si", vol. 10, No. 10 Sep. 11, 2008.

K. Tomioka et al., "III—V Nanowires on Si Substrate: Selective-Area Growth and Device Applications", IEEE Journal of Selected Topics in Quantum Electronics, vol. 17, No. 4 2011.

M. Akabori et al., "InGaAs nano-pillar array formation on partially masked InP(111)B by selective area metal-organic vapour phase epitaxial growth for two-dimensional photonic crystal application", Nanotechnology 14 Aug. 27, 2003.

M. Bjork et al., "One-dimensional Steeplechase for Electrons Realized", Nano Letters vol. 2, No. 2 2002.

Non-Final Office Action received for U.S. Appl. No. 16/009,406 dated Aug. 6, 2019.

Notice of Allowance received for U.S. Appl. No. 16/009,406 dated Nov. 21, 2019.

List of IBM Patents or Patent Applications Treated as Related, Jun. 15, 2018.

* cited by examiner

VERTICAL NANO-WIRE COMPLIMENTARY METAL-OXIDE-SEMICONDUCTOR TRANSISTOR WITH CYLINDRICAL III-V COMPOUND AND GERMANIUM CHANNEL

BACKGROUND OF THE INVENTION

The present disclosure generally relates to the field of semiconductors, and more particularly relates to vertical field effect transistors with III-V and germanium channels.

As silicon CMOS technology reaches its fundamental scaling limits, alternative materials such as high mobility III-V compounds (e.g., indium gallium arsenide) and silicon germanium have proven to be strong contenders for extending high performance logic. However, integrating free standing indium gallium arsenide and silicon germanium nanostructures on silicon has been difficult for current fabrication processes due to defect and chemistry incompatibilities.

SUMMARY OF THE INVENTION

In one embodiment, a method for forming a semiconductor structure is disclosed. The method comprises at least the following operations. One or more fin structures comprising gallium arsenide are epitaxially grown in contact with a portion of a substrate. A separate channel layer comprising indium gallium arsenide or germanium is formed in contact with a respective one of the one or more fin structures.

In another embodiment, a semiconductor structure is disclosed. The semiconductor structure comprises at least a substrate; and a first source/drain layer in contact with at least the substrate; a vertical channel including indium gallium arsenide or germanium in contact with at least the first/source drain layer; a gate structure in contact with at least the vertical channel; and a second source/drain layer in contact with at least inner sidewalls of the vertical channel.

In a further embodiment, an additional semiconductor structure is disclosed. The semiconductor structure comprises at least a substrate; and a first source/drain layer in contact with at least the substrate; a vertical channel including germanium in contact with at least the first/source drain layer and surrounding one or more oxide layers; a gate structure in contact with at least the vertical channel; and a second source/drain layer in contact with at least inner sidewalls of the vertical channel.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
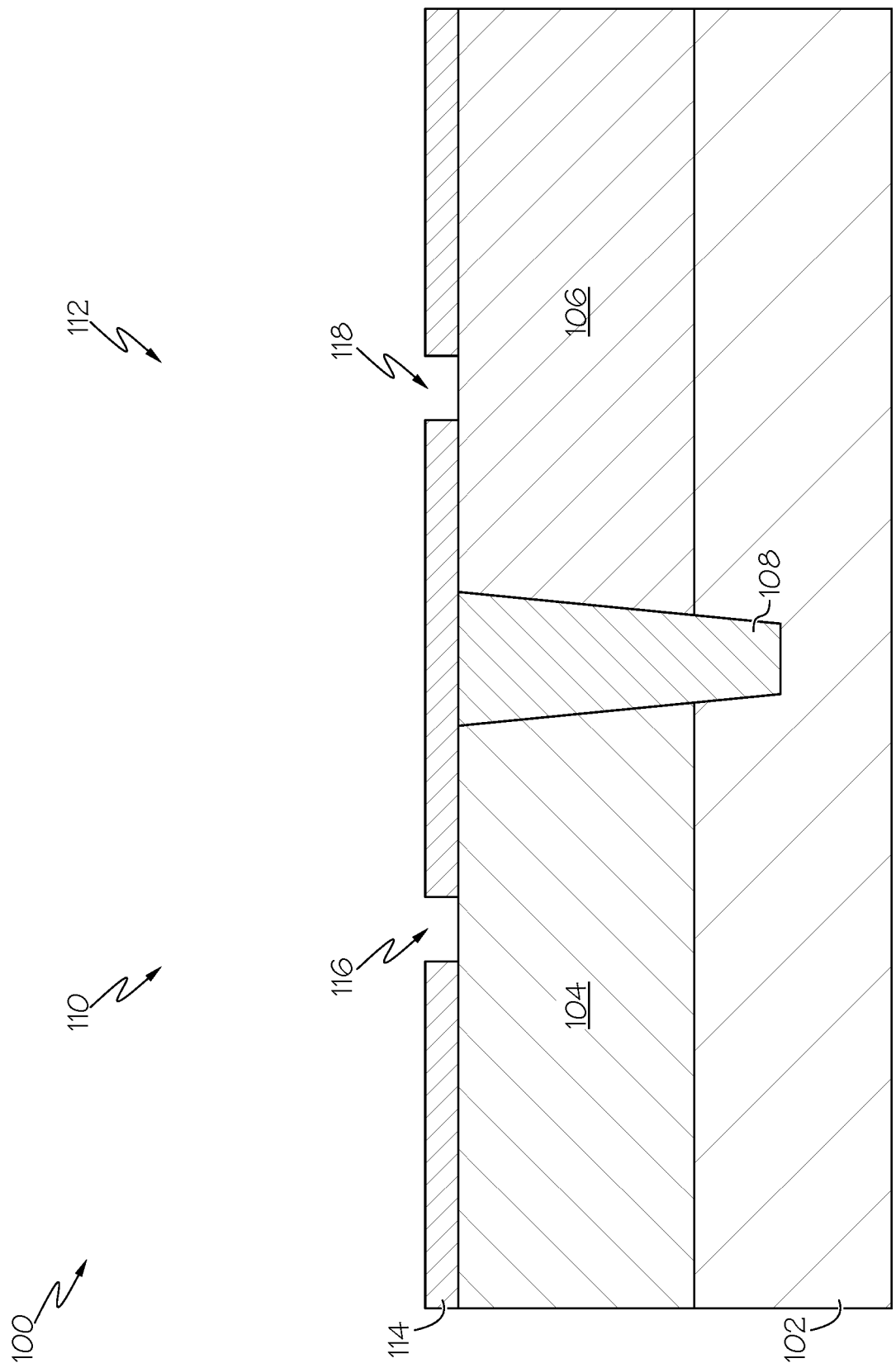
FIG. 1 is a cross-sectional view of a semiconductor structure after areas of an insulating layer have been patterned for formation of fin structures according one embodiment of the present disclosure.
Figure 2:
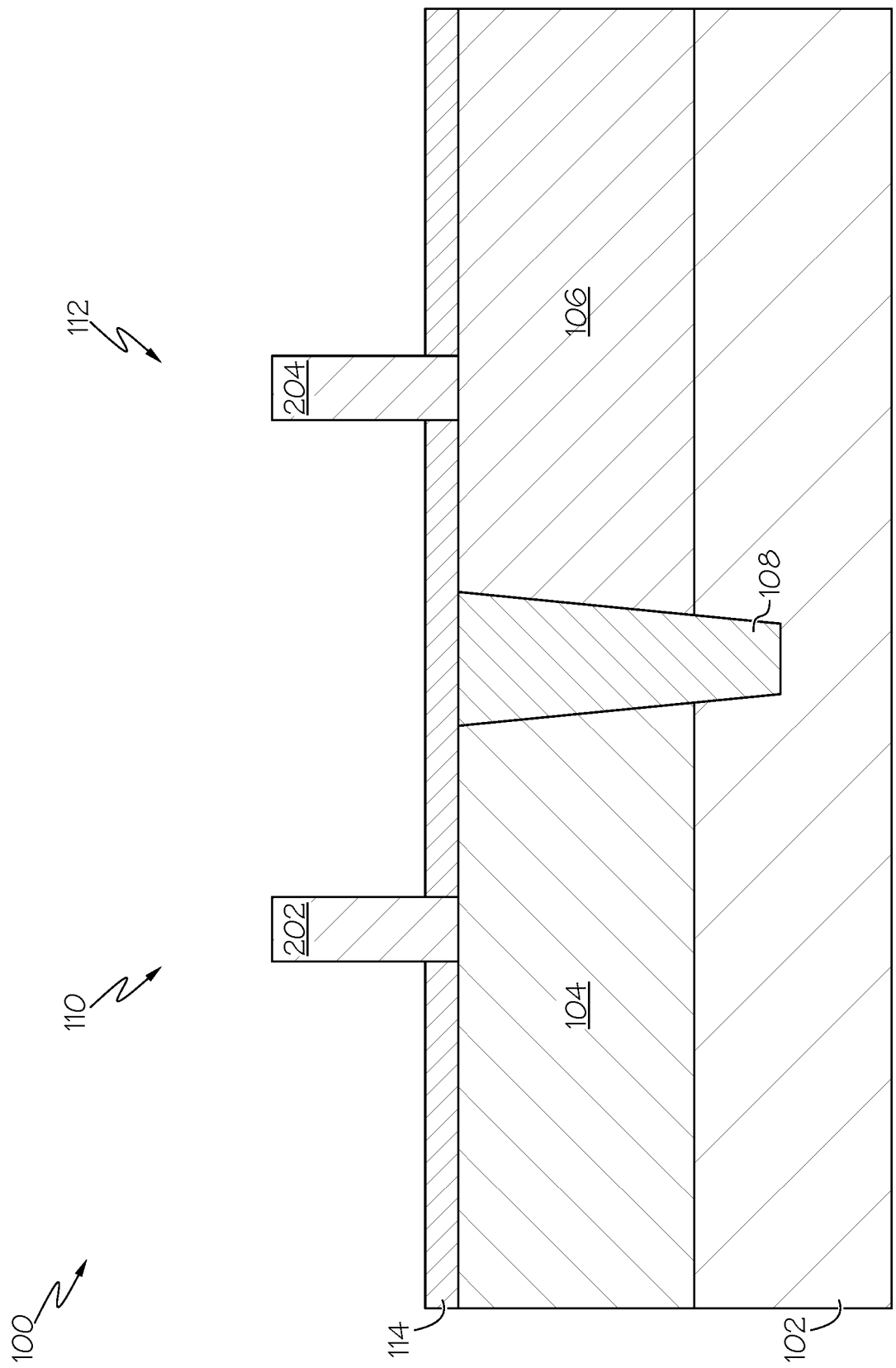
FIG. 2 is a cross-sectional view of the semiconductor structure after fin structures have been formed according one embodiment of the present disclosure.

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present disclosure may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Embodiments of the present invention relate generally to field-effect transistors ("FETs"), and more particularly to FETs having a III-V and Ge channel region that is generally vertical with respect to the horizontal plane of the silicon wafer. In the past, vertical FETs were introduced either in a trench or a V-groove to align the channel region of the FET vertically. Therefore, the area of the FET could be reduced because the channel did not use valuable horizontal area leading to a larger die area. However, free-standing III-V and Ge nanostructures on silicon have been difficult to integrate with vertical FETs because of the formation of defects, which act as leakage sources. In addition, III-V epi and Ge epi require different etching chemistries, which makes forming free-standing III-V and Ge nanostructures on a silicon substrate difficult. As will be discussed in greater detail below, embodiments of the present invention overcome this problem by providing position-controlled growth of vertical III-V/Ge nanowires on silicon without any buffering.

Referring now to the drawings in which like numerals represent the same or similar elements, FIG. 1 shows a semiconductor structure 100 at a given point in the fabrication process. For example, FIG. 1 shows a substrate 102 having a plurality well regions 104, 106 separated by an isolation region 108. The isolation region 108 defines a plurality of device areas 110, 112 where one device area 110 is for an n-type device and the other device area 112 is for a p-type device.

In one embodiment, the substrate 102 is a bulk substrate comprising silicon (Si) having a <111> orientation. In other embodiments, the substrate may be a silicon-on-insulator substrate. The well regions 104, 106 are formed within the substrate 102 using a well implantation process. The well implantation process may include forming a sacrificial oxide layer formed through oxidation to create a screening layer where well implants are to be created. Then, photolithography may be used to selectively define NFET and PFET areas for the wells 104, 106, and then implanting ions to form the wells 104, 106. A well 104 for an NFET may be formed by implanting p-type species (such as B, $BF_2$, In, and/or the like), while a well for a PFET is formed by implanting n-type species (such as As, P, Sb, and/or the like). The sacrificial oxide layer may then be removed (e.g., using HF).

FIG. 1 further shows an insulating layer 114 (e.g., $SiO_2$) is formed and patterned for a subsequent epitaxy process. The insulating layer 114 may be formed by using a deposition process such as atom layer deposition (ALD); chemical vapor deposition (CVD); plasma-enhanced chemical vapor deposition (PECVD); or thermally growing $SiO_2$ with a process such as rapid thermal anneal (RTA), furnace, or laser anneal on Si substrate. One or more lithography techniques are then performed to pattern the insulation layer 114 where channel structures are to be epitaxially grown. The patterning of the insulation layer 114 forms one or more trenches 116, 118 in each of the device areas 110, 112 exposing a top surface of the wells 104, 106.

After the insulating layer 114 has been patterned, one or more vertical buffer channel structures 202, 204 are epitaxially grown at the trenches 116, 118. In one embodiment, the buffer structures 202, 204 comprise gallium arsenide (GaAs) and are grown with an epitaxial process using gas(es), ambient, pressure(s), and temperature(s) with In, Ga, As, $SiH_4/H_2$, Ge containing precursors. It should be noted that the terms "epitaxially growing", "epitaxial growth", "epitaxially grown", and their variants mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {111} crystal surface will take on a {111} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatus that are suitable for use in one or more embodiments include, e.g., rapid thermal chemical vapor deposition (RT-CVD), low-energy plasma deposition (LEPD), ultra-high vacuum chemical vapor deposition (UHVCVD), low pressure chemical vapor deposition (LPCVD), liquid phase epitaxy (LPE), metal organic chemical vapor deposition (MPCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a gallium (Ga) and triethylgallium (TEG), AsH3 gas, trimethylgallium (TMGa) with arsenic (As4), arsenic sources with a CCl4 gas source, arsenic (As2), TDh4AAs, etc.

Figure 3:
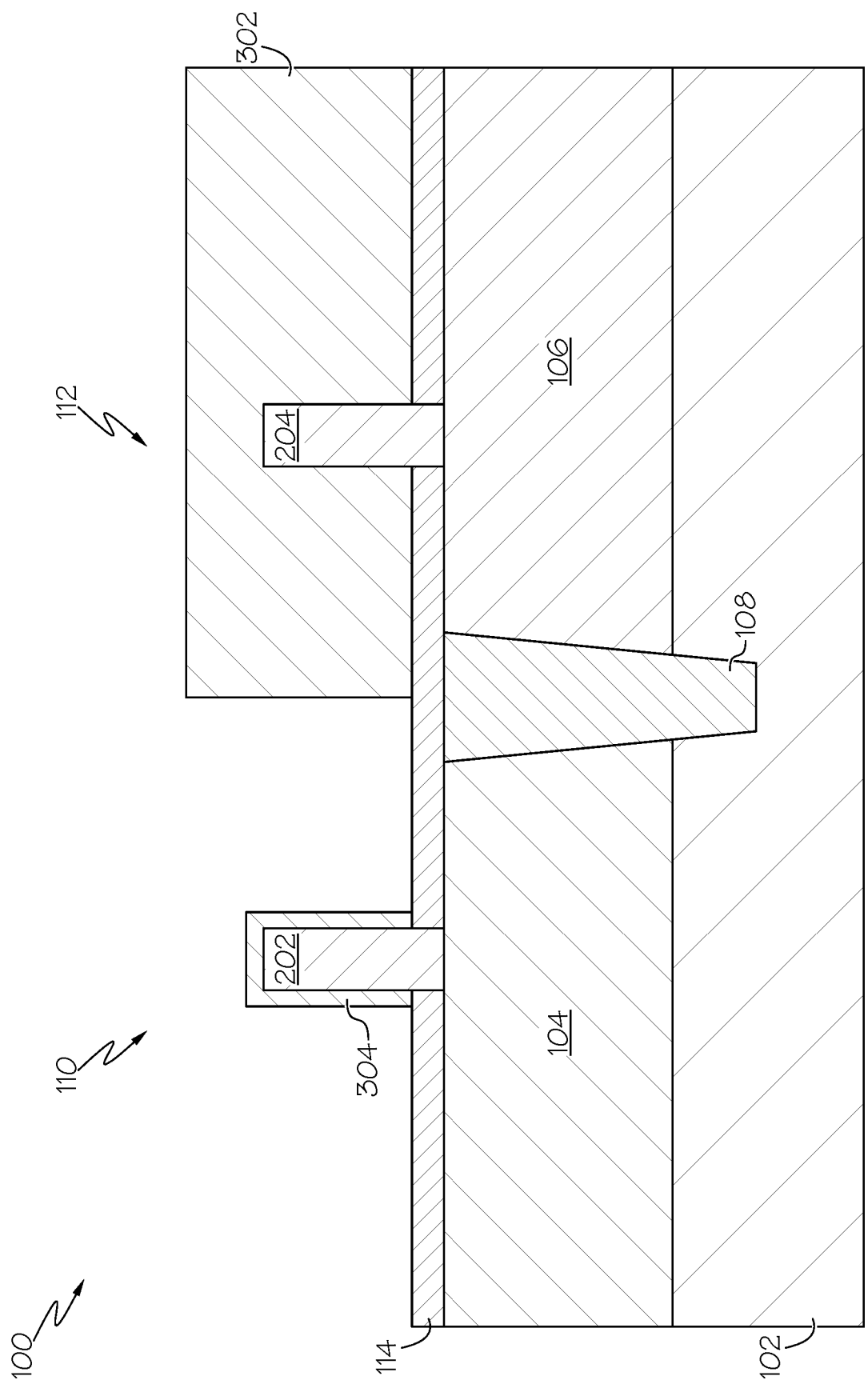
FIG. 3 is a cross-sectional view of the semiconductor structure after a III-V vertical channel layer has been formed on a fin structure in an NFET area of the semiconductor structure according one embodiment of the present disclosure.

In one embodiment, the buffer structures 202, 204 are epitaxially grown up from the wells 104, 106 and extend above a top surface of the insulating layer 114. The buffer structures 202, 204 may have a height of 20 nm-200 nm and width of 5 nm-50 nm. However, other dimensions are applicable as well. Once the initial buffer structures 202, 204 have been formed in each device area 110, 112 one of the device areas is masked off, as shown in FIG. 3. For example, a material capable of blocking the formation of epitaxy is deposited over the structure 100. Examples of this material include SiO2, SiN, OPL (Optical photo layer), etc. The material is patterned through a process involving masking, using industry-standard lithographic techniques, and etching away (e.g., RIE) the unmasked material to form an epi block mask 302 on one side of the structure. In the example shown in FIG. 3, the PFET side 112 comprise the epi block mask 302 while the NFET side 110 remains exposed.

After the epi block mask 302 has been formed, an epitaxial process is performed to form an epitaxial vertical channel layer 304 in contact and surrounding the exposed portions of the unmasked buffer structure(s) 202. In one embodiment, the epitaxial channel layer 304 contacts the sidewalls and the top surface of the unmasked buffer structure(s) 202. In the example shown in FIG. 3, the unmasked side of the structure is the NFET side and the epitaxial channel layer 304 may be a III-V material/compound such as indium gallium arsenide (InGaAs). The InGaAs material may have different percentages of In, where InGaAs may be GaAs, In.02Ga.08As, In0.53Ga0.47As, In0.8Ga0.2As, InAs, etc. The epitaxial channel layer 304 may have a thickness in the range of 2 nm to 200 nm along the inside GaAs outer line, although other dimensions are applicable as well. An epitaxial process(es) may be utilized to form/grow the epitaxial channel layer 304 using gas(es), ambient, pressure(s), and temperature(s) with In, Ga, As, SiH4/H2, Ge containing precursors.

Figure 4:
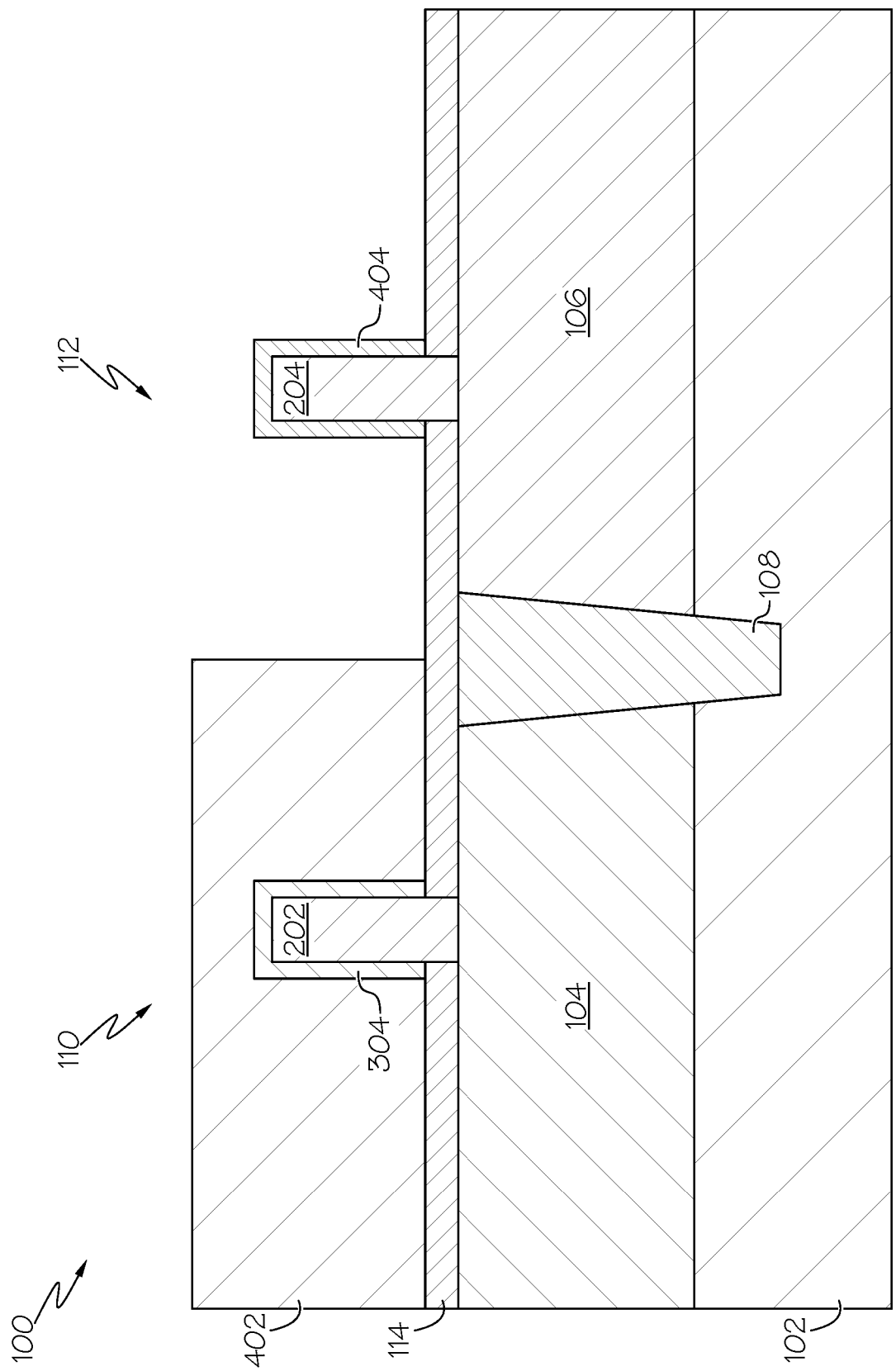
FIG. 4 is a cross-sectional view of the semiconductor structure after a germanium vertical channel layer has been formed on a fin structure in a PFET area of the semiconductor structure according one embodiment of the present disclosure.

Once the InGaAs layer 304 has been formed on the NFET buffer structure(s) 202, the NFET side 112 of the structure 100 is masked with an epi block mask 402, as shown in FIG. 4. A process similar to that discussed with respect to FIG. 3 may be used to form the epi block mask 402 on the NFET side 110 of the structure while maintain the PFET side 112 exposed. After the NFET epi block mask 402 has been formed, an epitaxial process is performed to form an epitaxial vertical channel layer 404 in contact and surrounding the exposed portions of the unmasked PFET buffer structure(s) 204. In one embodiment, the epitaxial channel layer 404 contacts the sidewalls and the top surface of the unmasked PFET buffer structure(s) 204. In the example shown in FIG. 4, the epitaxial channel layer 404 may be Ge and have a thickness in the range of 2 nm-200 nm along the inside GaAs outer line. However, other dimensions are applicable as well. An epitaxial process(es) may be utilized to form/grow the epitaxial channel layer 404 using gas(es), ambient, pressure(s), and temperature(s) with In, Ga, As, SiH4/H2, Ge containing precursors. The epitaxial channel layer 404 may be formed/grown using gas(es), ambient, pressure(s), and temperature(s) with Ge containing precursors. CVD techniques may use gas sources such as GeH4, SiH4, Si2H6, or SiCl2H2 for pyrolysis of the precursor gases at elevated temperatures. In at least some embodiments, the vertical channels 304, 404 have a cylindrical shape and may be referred to as nanowires.

Figure 5:
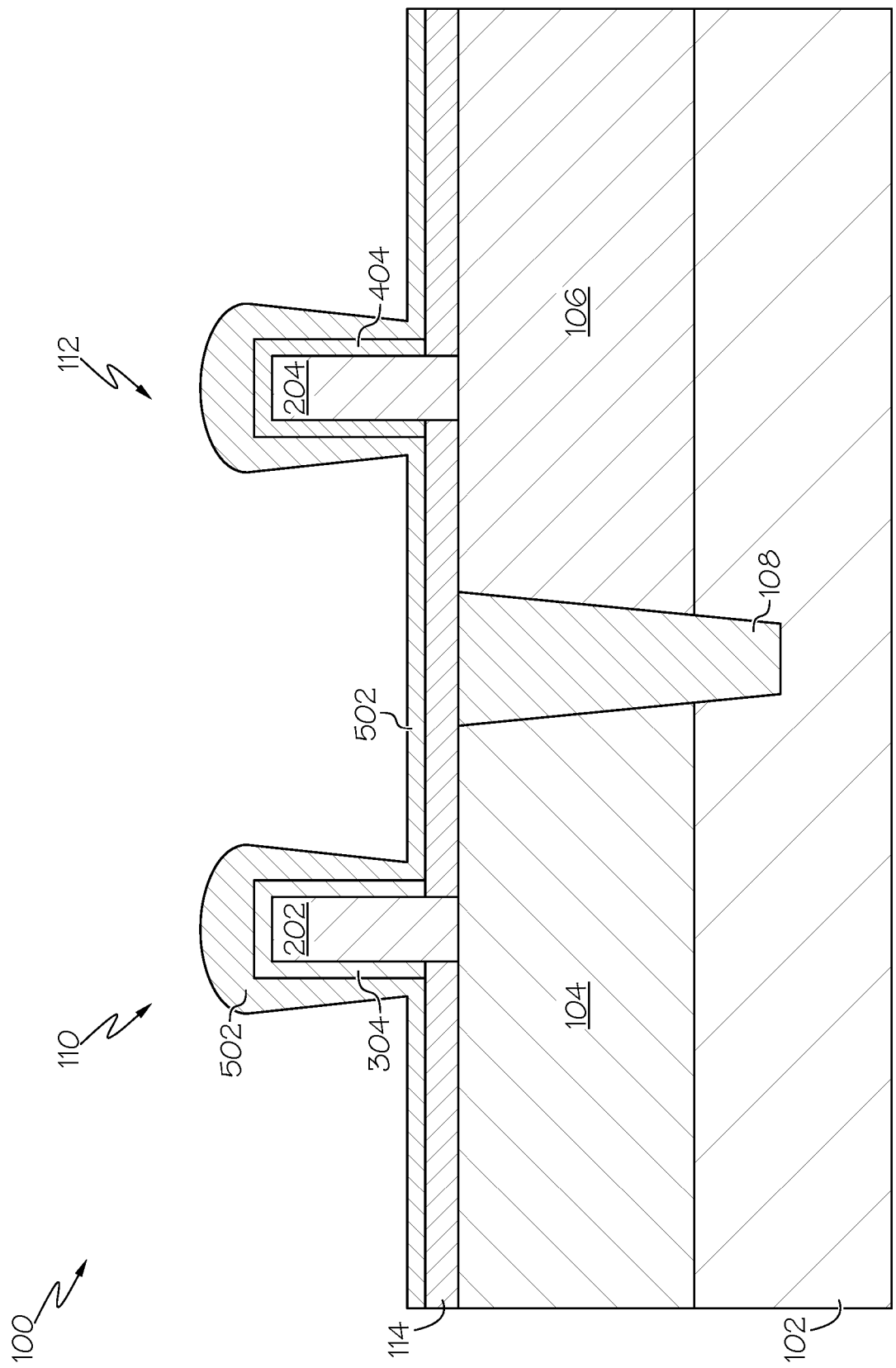
FIG. 5 is a cross-sectional view of the semiconductor structure after a capping layer has been formed over the structure according one embodiment of the present disclosure.
Figure 6:
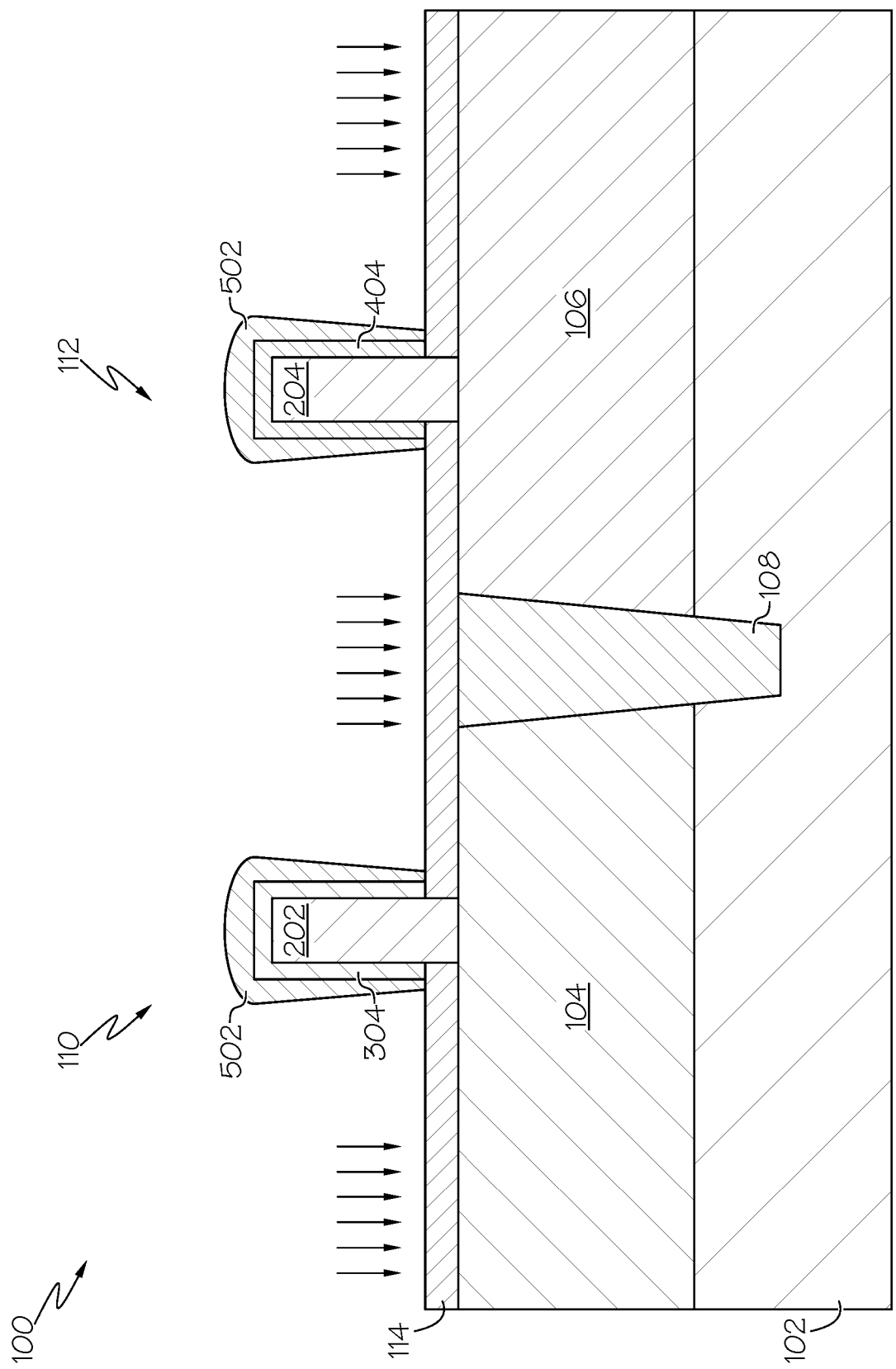
FIG. 6 is a cross-sectional view of the semiconductor structure after portions of the capping layer have been removed from the insulating layer according one embodiment of the present disclosure.

A capping layer 502 is then formed over the structure 100, as shown in FIG. 5. The capping layer 502 may be formed in contact with a top surface of the insulating layer 114; sidewalls of the epitaxial channel layers 304, 404; and a top surface of the epitaxial channel layers 304, 404. The capping layer 502 may comprise, for example, silicon nitride (SiN) and may be formed utilizing one or more processes such as CVD, PECVD, LPCVD, and/or the like. In one embodiment, the capping layer 502 is a non-uniform layer comprising a domed top portion over the epitaxial channel layers 304, 404 and further comprising angled sidewalls adjacent to the epitaxial channel layers 304, 404. An anisotropic etching process, as indicated by the arrows, is then performed to remove the capping layer material from horizontal surfaces, as shown in FIG. 6. This process exposes a top surface of the insulating layer 114 and reduces the amount of capping material above the top surface of the epitaxial channel layers 304, 404.

Figure 7:
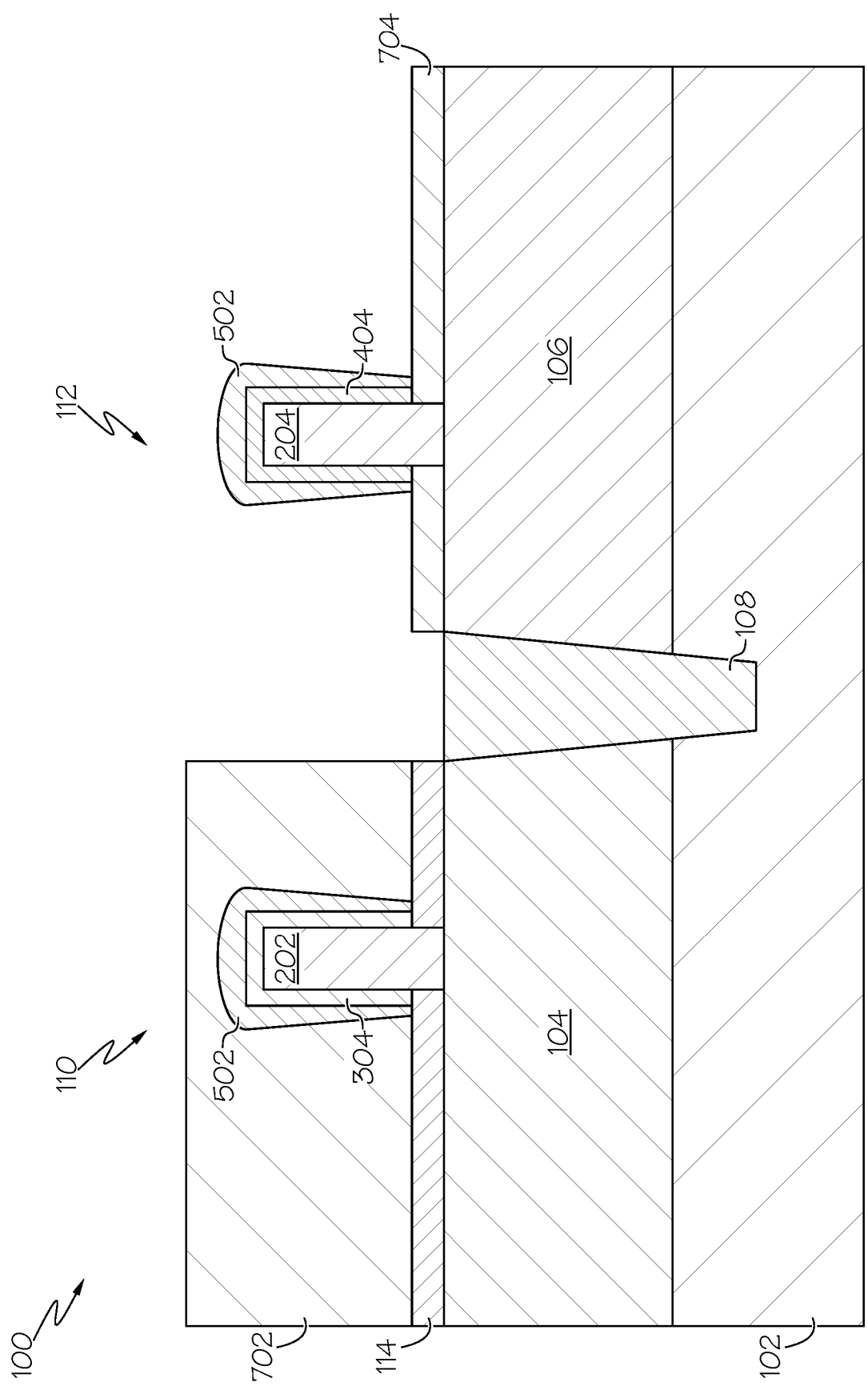
FIG. 7 is a cross-sectional view of the semiconductor structure after a bottom source/drain layer has been formed in the PFET area of the semiconductor structure according one embodiment of the present disclosure.

One side of the structure 100 of the structure is then masked off, as shown in FIG. 7. For example, FIG. 7 shows that the NFET area 110 is masked off by forming a masking layer 702 thereon, while the PFET area 112 remains exposed. It should be noted that, in other embodiments, the PFET area 112 may be masked off while the NFET area 110 remains exposed. The masking layer 702 is an epi blocking layer and may comprise SiO2, SiN, OPL, SiOC(N), etc. The masking layer 702 may be formed similar to the processes discussed above with respect to FIGS. 3 and 4. The insulating layer 114 is then removed from the exposed PFET area 112. Removal of the insulating layer 114 exposes a bottom surface of the capping layer 502; a bottom surface of the epitaxial channel layer 404; and a portion of the sidewalls of the buffer channel layer 204 that were in contact with the insulating layer 114.

A bottom source/drain layer 704 is then formed using an epitaxy process. Epitaxy of SiGe layers may be formed by an ultrahigh vacuum chemical vapor deposition system. Silane (SiH4) may be used as the silicon source. Dilute germane (% GeH4 in H2) may be used as a germanium source. % B2H2 in H2 and % PH3 in H2 may be used as p-type dopant and n-type dopant. The bottom source/drain layer 704 may either be a source layer or a drain layer. In one embodiment, the bottom source/drain layer 704 formed for the PFET device 112 comprises boron doped germanium (Ge:B). The bottom source/drain layer 706 may contact a tope surface of the PFET well 104; a bottom surface of the epitaxial channel layer 404; and a portion of the sidewalls of the buffer structure 204 that were in contact with the insulating layer 114.

Figure 8:
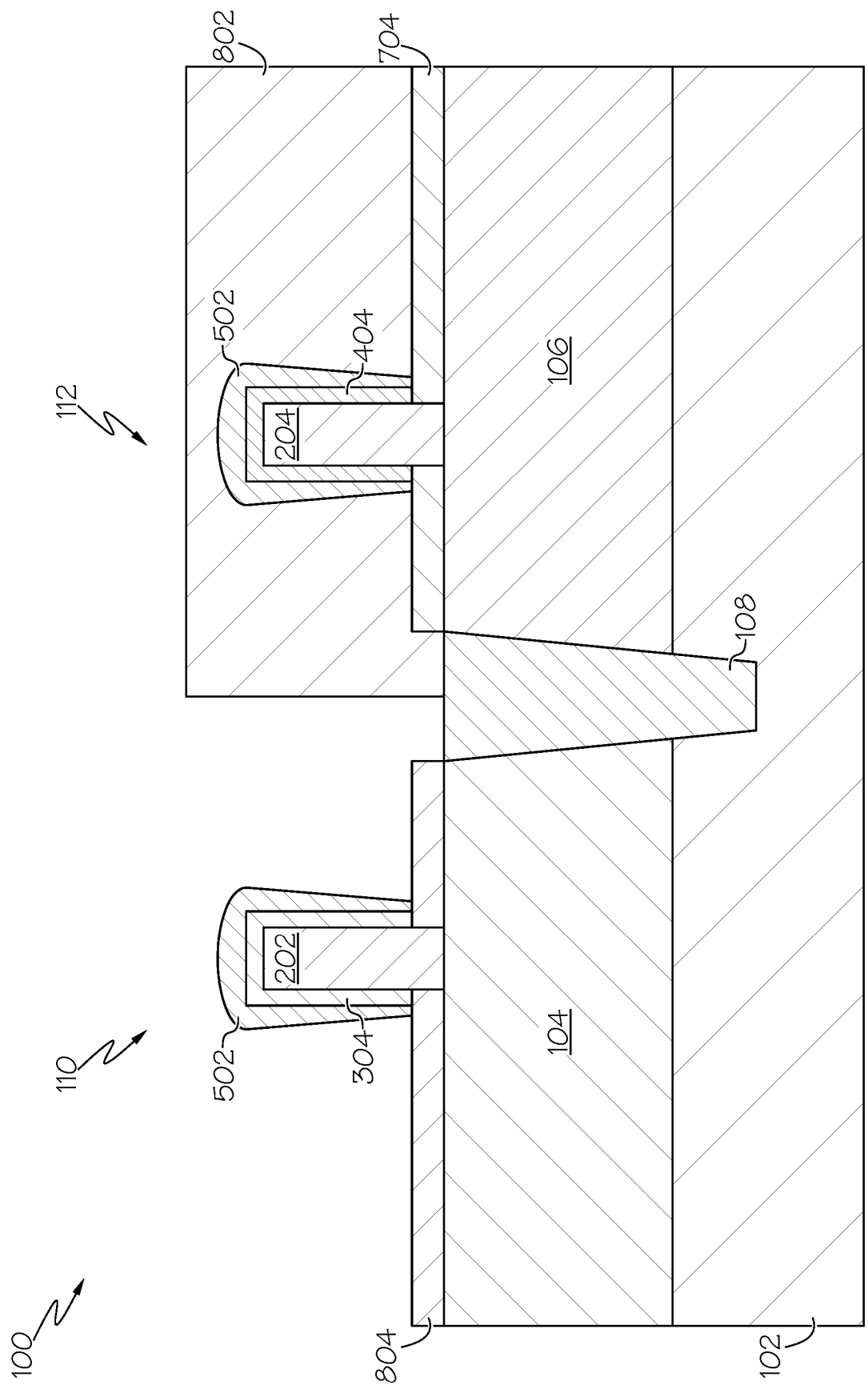
FIG. 8 is a cross-sectional view of the semiconductor structure after a bottom source/drain layer has been formed in the NFET area of the semiconductor structure according one embodiment of the present disclosure.

A similar process may then be performed for the NFET device 110, as shown in FIG. 8. For example, the PFET area 112 is masked off by forming a masking layer 802 thereon, while the NFET area 110 remains exposed. The insulating layer 114 is then removed from the exposed NFET area 110. An HF based WET or CxFy, F, CHFx, SFx, CFx based RIE may be used to remove the insulating layer 114. Removal of the insulating layer 114 exposes a bottom surface of the capping layer 502; a bottom surface of the epitaxial channel layer 304; and a portion of the sidewalls of the buffer structure 202 that were in contact with the insulating layer 114. A bottom source/drain layer 804 is then formed using an epitaxial process similar to the PFET bottom source/drain layer but with parameters, materials, gases, etc. particular to forming the NFET bottom source/drain layer 804. The bottom source/drain layer 804 may either be a source layer or a drain layer. Epitaxy of SiGe layers may be formed by an ultrahigh vacuum chemical vapor deposition system. Silane (SiH4) may be used as the silicon source. Dilute germane (% GeH4 in H2) may be used as a germanium source. % B2H2 in H2 and % PH3 in H2 may be used as p-type dopant and n-type dopant. The bottom source/drain layer 704 may either be a source layer or a drain layer. In one embodiment, the bottom source/drain layer 804 formed for the NFET device 110 comprises silicon doped indium arsenide (InAs:Si). The bottom source/drain layer 804 may contact a tope surface of the NFET well 104; a bottom surface of the epitaxial channel layer 304; and a portion of the sidewalls of the buffer structure 202 that were in contact with the insulating layer 114.

Figure 9:
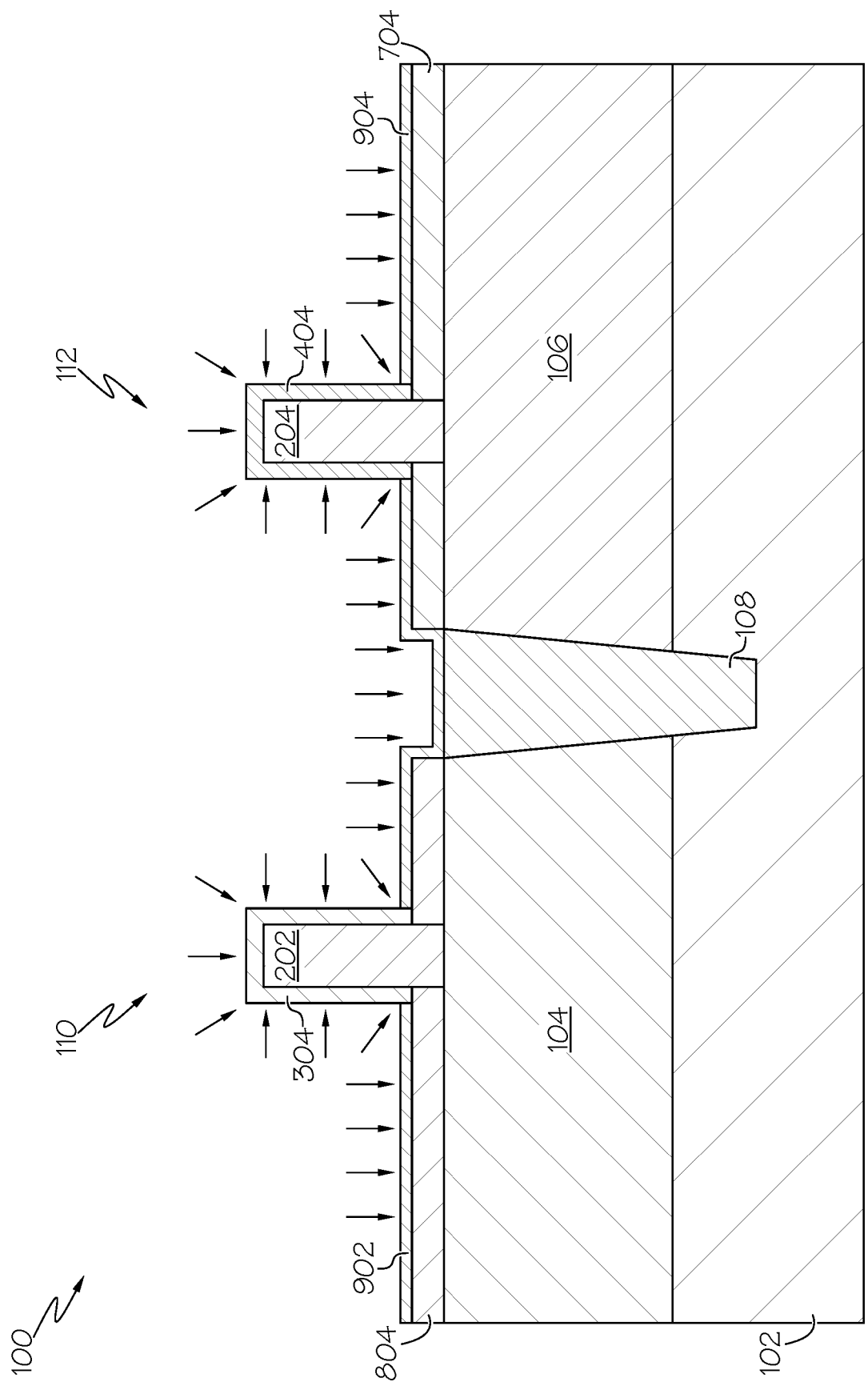
FIG. 9 is a cross-sectional view of the semiconductor structure after the capping layers have been removed from the vertical structures and a bottom spacer layer has been formed in the NFET and PFET areas of the semiconductor structure according one embodiment of the present disclosure.

A bottom spacer layer 902, 904 is then formed on the structure 102, as shown in FIG. 9. In one embodiment, the bottom spacer 902, 904 comprises an insulating material (such as silicon oxide, silicon nitride, silicon oxynitride, or a combination of these) and may be formed using any conventional deposition process such as, for example, chemical vapor deposition (CVD) or high density plasma (HDP) CVD, and subsequent etching techniques. The deposited spacer material is then subsequently etched (as indicated by the arrows) to form the final spacer structures. The final spacer structures 902, 904 respectively contact the top surface of the NFET bottom source/drain 804; the top surface of the PFET bottom source/drain 704; a portion of the sidewalls of the NFET and PFET epitaxial channel layers 404, 304; and a to surface of the isolation region 108. In one embodiment, the bottom spacer 902, 904 is a continuous layer formed over both NFET and PFET devices 110, 112.

Figure 10:
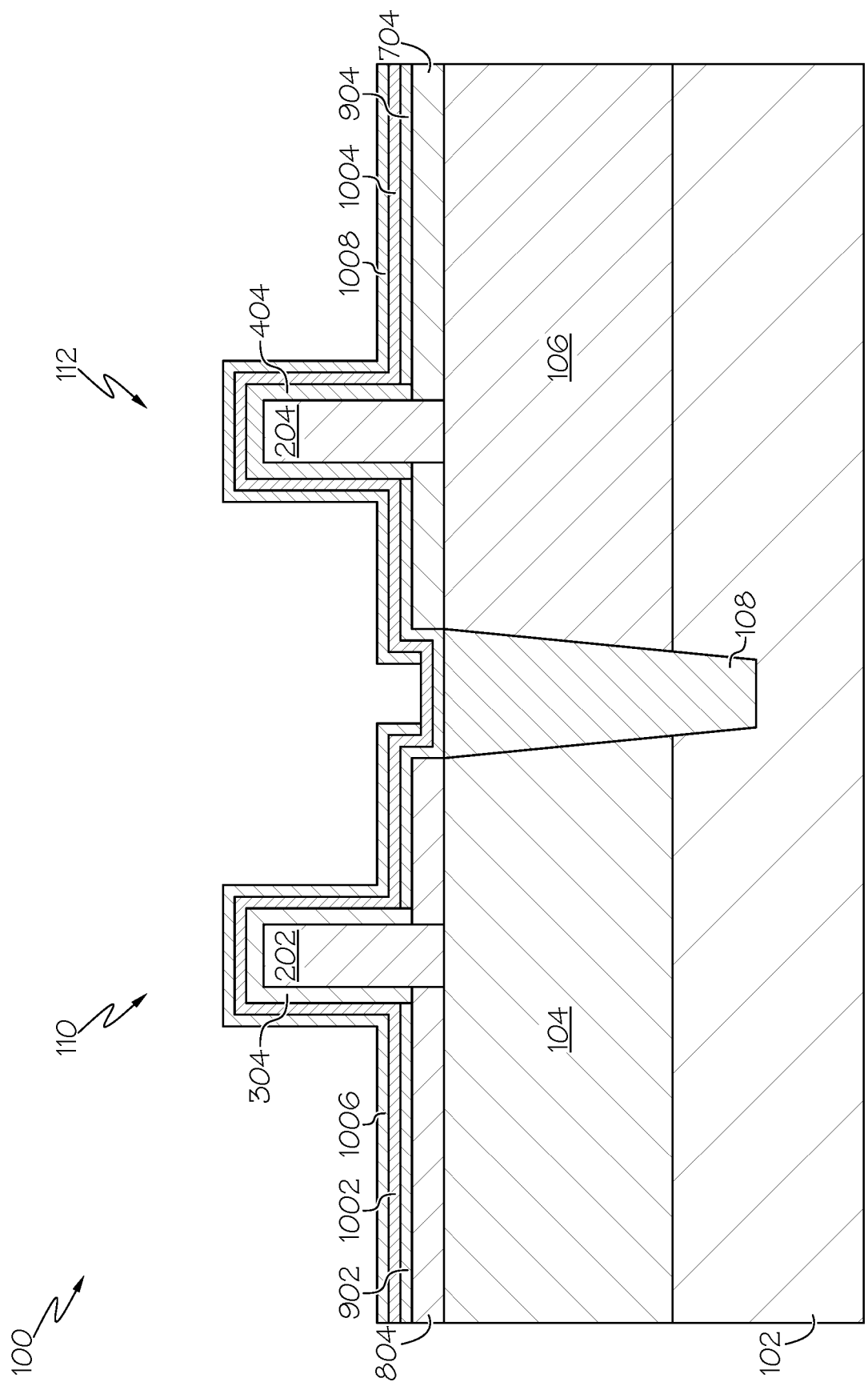
FIG. 10 is a cross-sectional view of the semiconductor structure after gate structures have been formed according one embodiment of the present disclosure.

After the bottom spacer 902, 904 has been formed, a high-k dielectric layer 1002, 1004 and metal gate layer 1006, 1008 is formed on each of the NFET device 110 and PFET device 112, as shown in FIG. 10. In one embodiment, the high-k dielectric layer 1002 is formed by blanket depositing a high-k dielectric material deposited over the entire structure 100, for example by CVD (chemical vapor deposition), PECVD (plasma enhanced chemical vapor deposition), or ALD (Atomic layer deposition). Excessive high-k gate dielectric material may be removed, for example, by polishing such as chemically mechanical polishing (CMP) and/or etching to form the high-k gate dielectric layers 1002, 1004.

The high-k gate material forms the high-k dielectric layer 1002, 1004 respectively on, in contact with, and conforming to a top surface of the bottom spacer 902; sidewalls and a top surface of the NFET epitaxial channel structure 404; and sidewalls and a top surface of the PFET epitaxial channel structure 304. In one embodiment, the high-k dielectric layer 1002, 1004 is a continuous layer formed over both is a continuous layer formed over both NFET and PFET devices 110, 112. Examples of high-k materials include but are not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZm_{1/3}Nb_{2/3}\,O_3$). The high-k material can further include dopants such as lanthanum and/or aluminum. The stoichiometry of the high-K compounds can vary.

In one embodiment, the metal gate layers 1006, 1008 are formed by depositing one or more PFET conductive materials over the entire structure 100 and in contact with the high-k dielectric layer 1002, 1004. The PFET device 112 is then masked off and one or more NFET conductive materials are deposited over the entire structure 100. The masking layer is then removed from the PFET device 112. In other embodiments, the NFET device 110 may be masked off during deposition of the PFET gate layers.

Examples of conductive gate materials include (but are not limited to) polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive gate material may further comprise dopants that are incorporated during or after deposition.

The conductive gate material may comprises multiple layers such as gate work function setting layer (work function metal) and gate conductive layer. The work function metal be deposited employing CVD, sputtering, or plating. The work function metal layers may comprise one or more metals having a function suitable to tune the work function of NFETs or PFETs. In various embodiments, a work function layer may be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer may include multiple layers of work function materials, for example, a work function layer can be a TiN/TiC stack.

Figure 11:
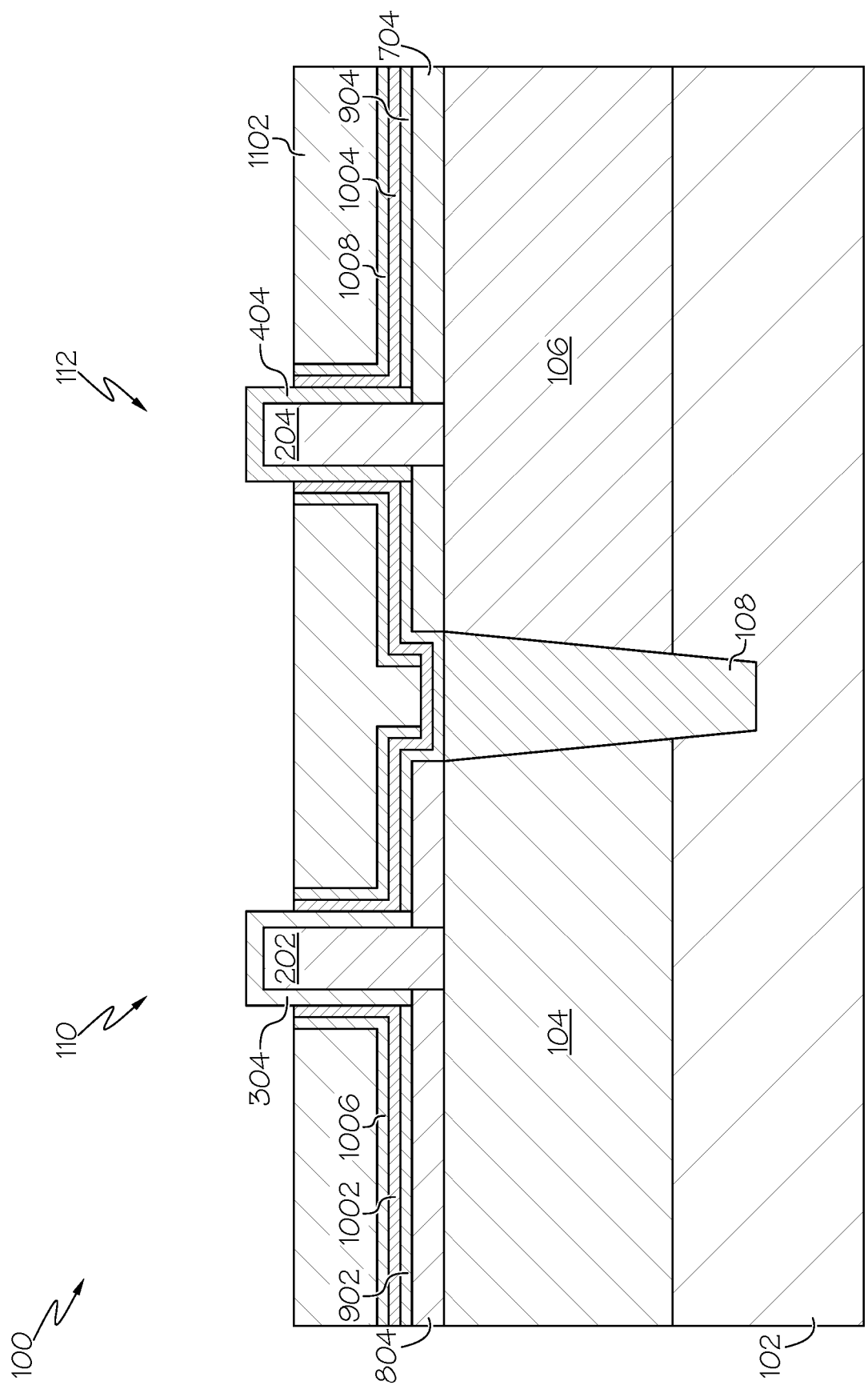
FIG. 11 is a cross-sectional view of the semiconductor structure after portions of an oxide layer and portions of the gate structures have been recessed according one embodiment of the present disclosure.
Figure 12:
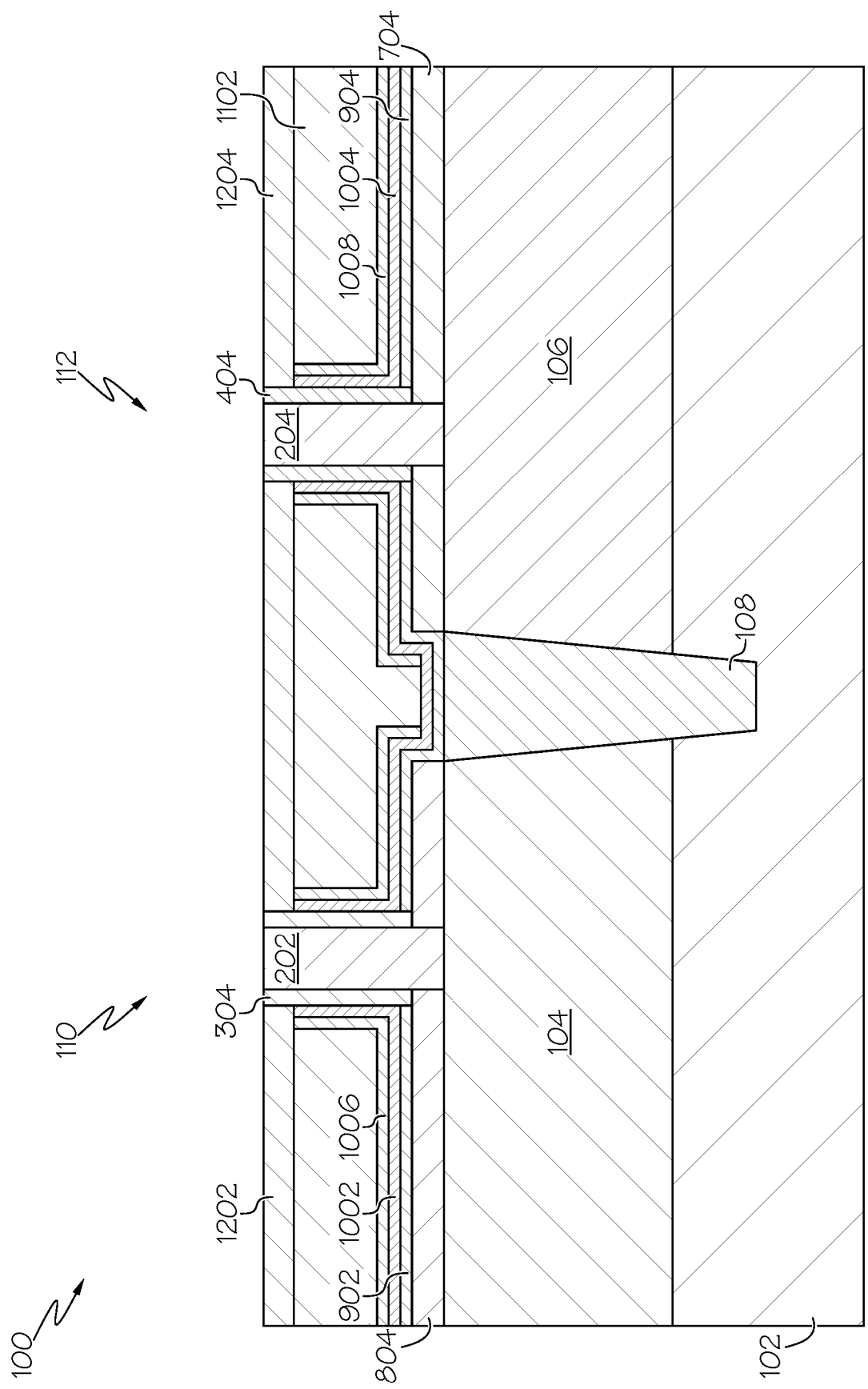
FIG. 12 is a cross-sectional view of the semiconductor structure after a top spacer layer has been formed in the NFET and PFET areas of the semiconductor structure according one embodiment of the present disclosure.

FIG. 11 shows that after the metal gates 1006, 1008 have been formed, an oxide layer 1102 is formed on the entire structure 110 and recessed via, for example, a chemical mechanical polishing (CMP) process. This process polishes the oxide material, metal gates 1006, 1008, and dielectric layer 1002, 1004 below a top surface of the NFET epitaxial channel structure 404 and the PFET epitaxial channel structure 304. A protective liner 1202, 1204 such as (but not limited to) silicon nitride is then formed, as shown in FIG. 12. In one embodiment, the protective liner 1202, 1204 acts as a top spacer layer and contacts a top surface of the oxide layer 1102; a portion of the sidewalls of the NFET epitaxial channel structure 404; and a portion of the sidewalls of the PFET epitaxial channel structure 304. A top surface of the protective liner 1202, 1204 may be planar with a top surface of the NFET epitaxial channel structure 404; PFET epitaxial channel structure 304; and the buffer channel structures 202, 204. In one embodiment, the protective liner 1202, 1204 is a continuous layer formed over both NFET and PFET devices 110, 112.

Figure 13:
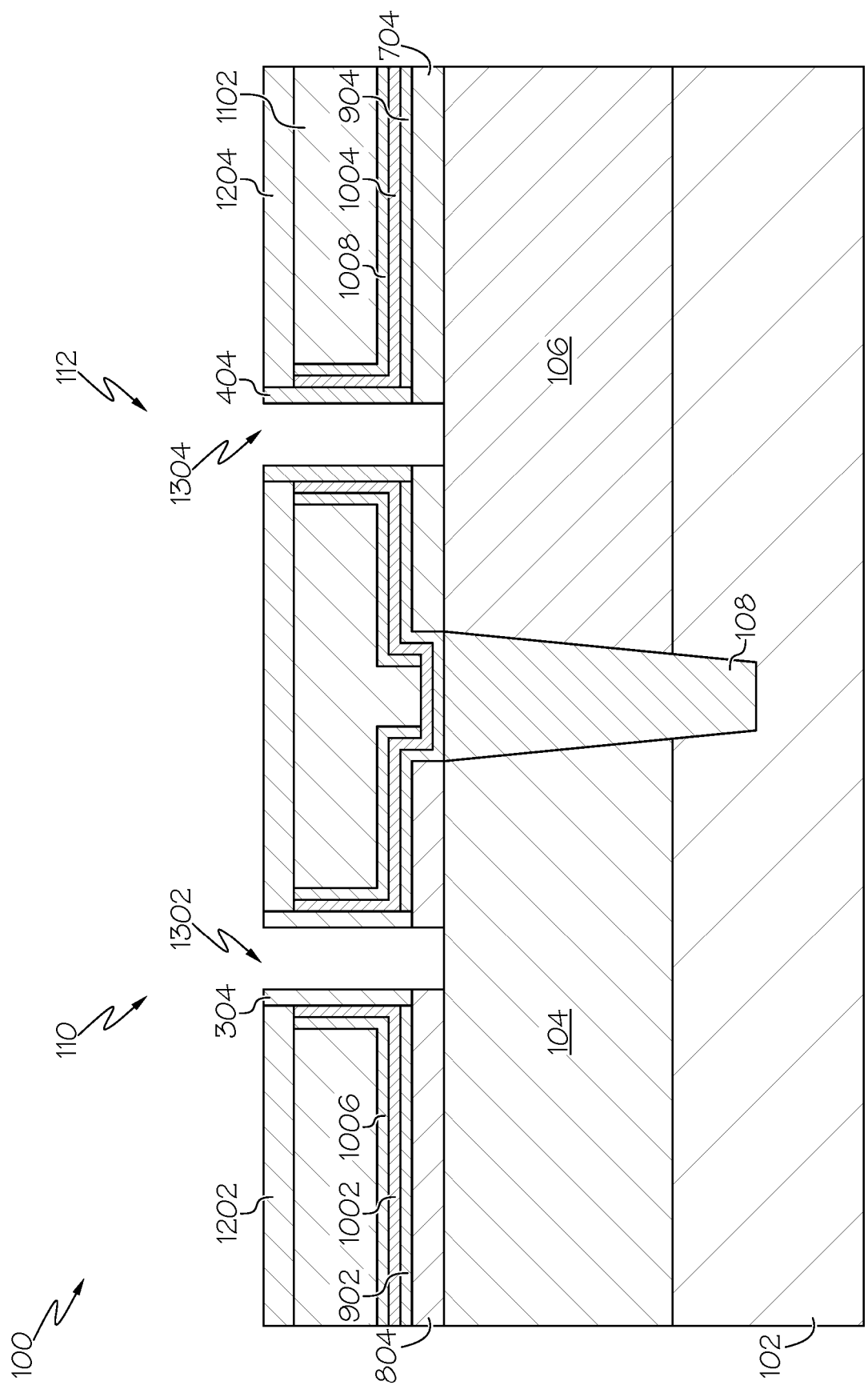
FIG. 13 is a cross-sectional view of the semiconductor structure after the fin structures have been removed according one embodiment of the present disclosure.

In some embodiments, the buffer structures 202, 204 may be removed, as shown in FIG. 13. This helps minimize current leakage that may occur with the buffer structures 202, 204. The buffer structures 202, 204 may be removed, for example, by a selective plasma etching technique that removes the buffer structures 202, 204 selective to the epitaxial channel structures 304, 404. In one embodiment, removal of the buffer structures 202, 204 results in free standing InGaAs and Ge channel structures 304, 404 on a silicon substrate 102.

Removal of the buffer structures 202, 204 also forms trenches 1302, 1304 exposing inner sidewalls of the NFET epitaxial channel structure 404; inner sidewalls of the NFET bottom source/drain 804; inner sidewalls of the PFET epitaxial channel structure 304; inner sidewalls of the PFET bottom source/drain 704; and a portion of the top surface of the well areas 104, 106 of the substrate 102.

Figure 14:
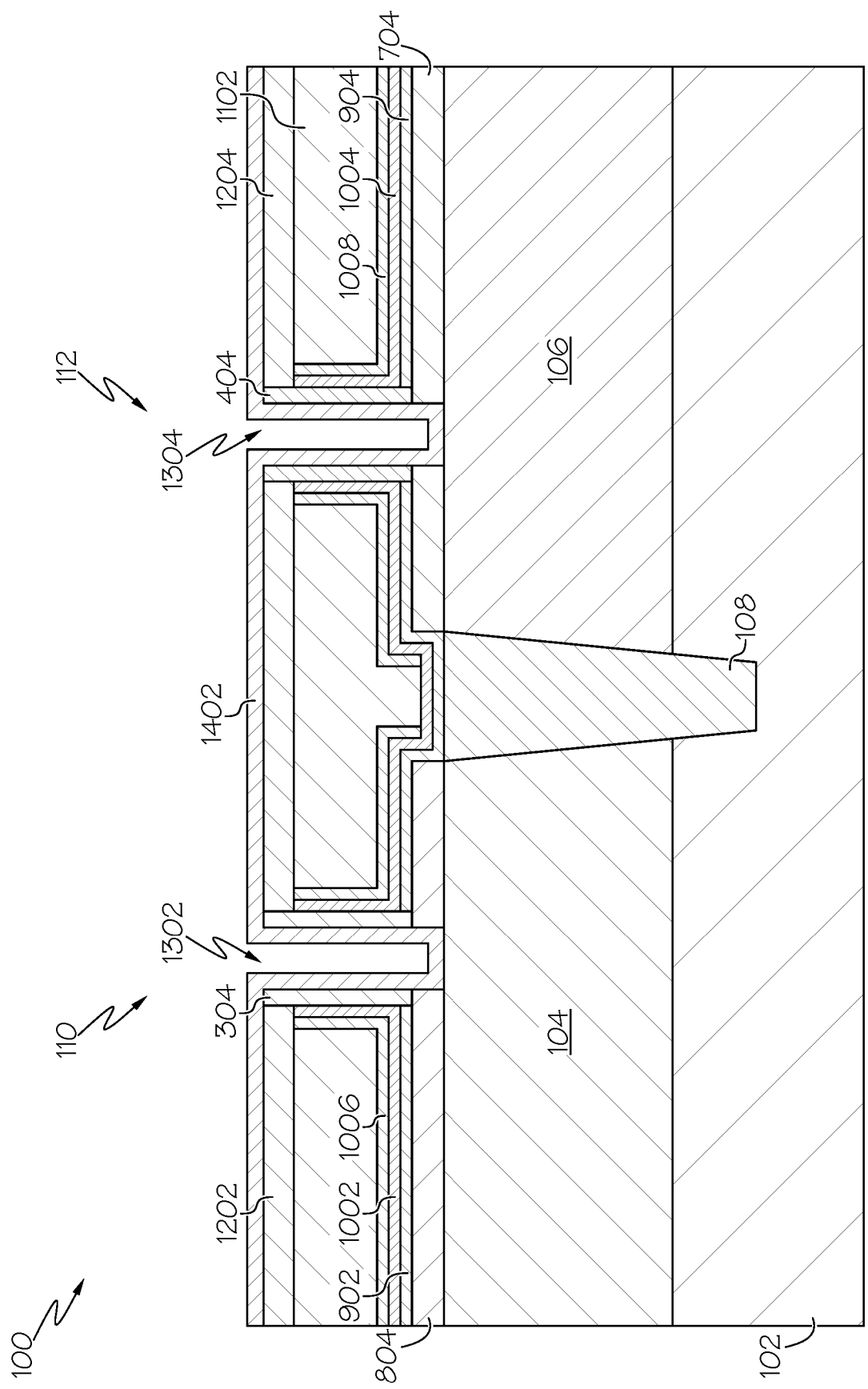
FIG. 14 is a cross-sectional view of the semiconductor structure after a capping layer and an oxide layer have been formed according one embodiment of the present disclosure.

A passivation or capping layer 1402 is then formed on the structure 100, as shown in FIG. 14. In one embodiment, the capping layer 1402 comprises aluminum oxide (Al₂O₃) and is deposited via ALD. However, other materials/compounds and deposition techniques are applicable as well. For example, the Al₂O₃ may be replaced with or used in combination with HfO2, ZrO2, SiO2, GeO2, Si rich GeO2, Si/GeO2, SiO2/GeO2, Si/SiO2, a combination thereof, and/or the like. The capping layer 1402 may contact a top surface of the top spacer 1202, 1204; a top surface and inner sidewalls of the NFET epitaxial channel structure 404; a top surface and inner sidewalls of the PFET epitaxial channel structure 304; inner sidewalls of the NFET and PFET bottom source drains 804, 704; and the exposed top surface of the substrate well areas 104, 106. As shown in FIG. 14, the capping layer 1402 may form a "U" shape within the trenches 1302, 1304.

Figure 15:
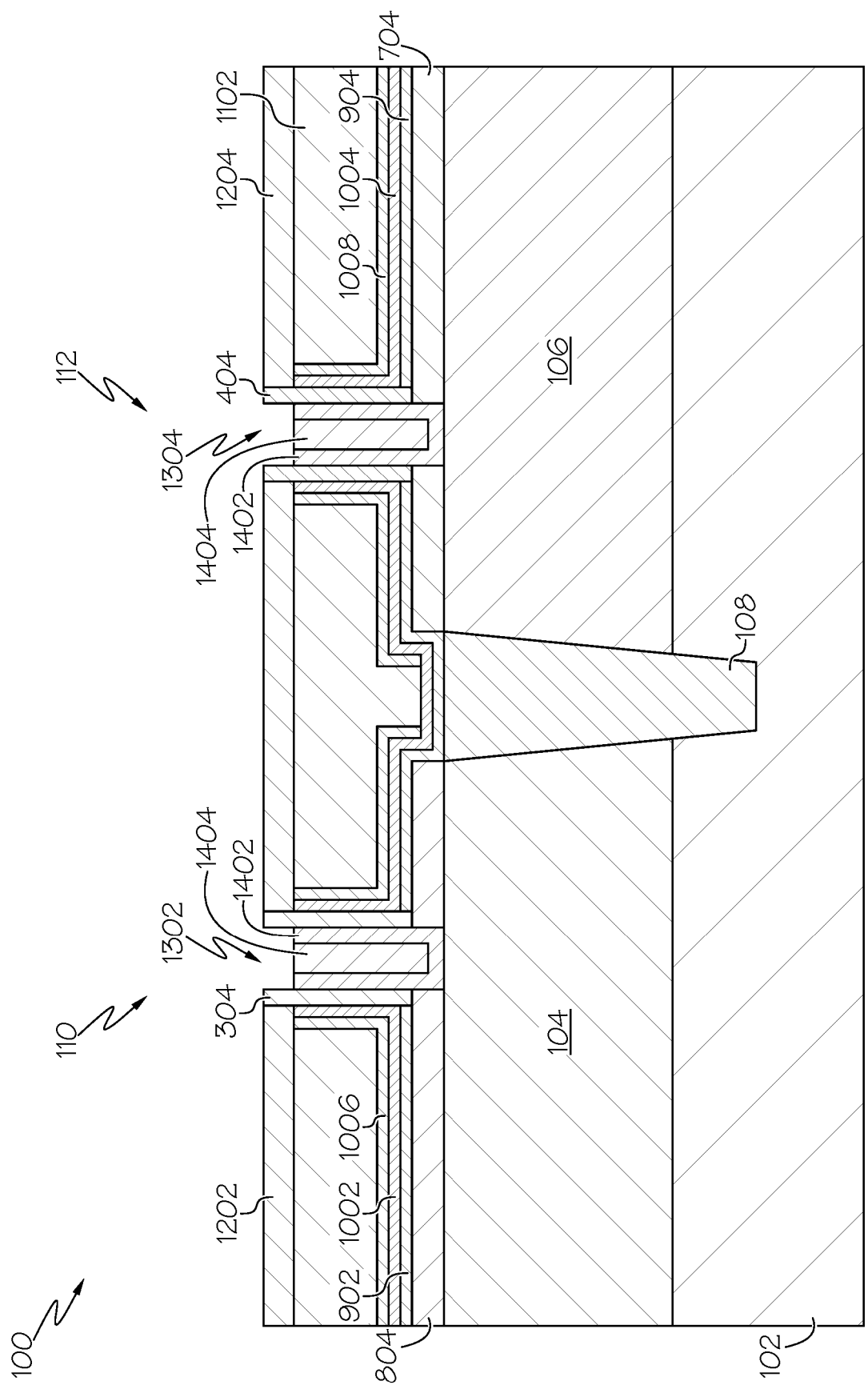
FIG. 15 is a cross-sectional view of the semiconductor structure after the capping layer and oxide layer have been recessed according one embodiment of the present disclosure.

FIG. 14 also shows an oxide layer 1404 is formed on the structure 100 via one or more deposition techniques (e.g., SiO2 by CVD, PECVD, LPPVD following by CMP) after the capping layer 1402 (Al2O3, Si, SiN, GeO2, SiO2 by ALD, CVD, PECVD, PVD) has been formed. The oxide layer 1404 contacts a top surface of the capping layer 1402, and inner sidewalls and a top surface of the passivation layer 1402 within the trenches 1302, 1304. The oxide layer 1404 is then recessed (HF based WET etching, or COR/SiConi based RIE), as shown in FIG. 15. In one embodiment, the oxide layer 1404 is recessed down below at least the top surface of the top spacer layer 1202, 1204 using a process such as CMP, a combined gas cluster ion beam (GCIB), and/or the like. This process results in only a portion of the oxide layer 1404 remaining within the trenches 1302, 1304. FIG. 15 further shows the capping layer 1402 is removed from the top surface of the top spacer 1202, 1204; the surface of the NFET and PFET epitaxial channel structures 404, 304; and a portion of the inner sidewalls of the NFET and PFET epitaxial channel structures 404, 304 within the trenches 1302, 1304. In one embodiment, the top surfaces of the capping layer 1402 and oxide layer 1404 remaining in the trenches 1302, 1304 are co-planar. The capping layer 1402 and oxide layer 1404 provide for better short channel control.

Figure 16:
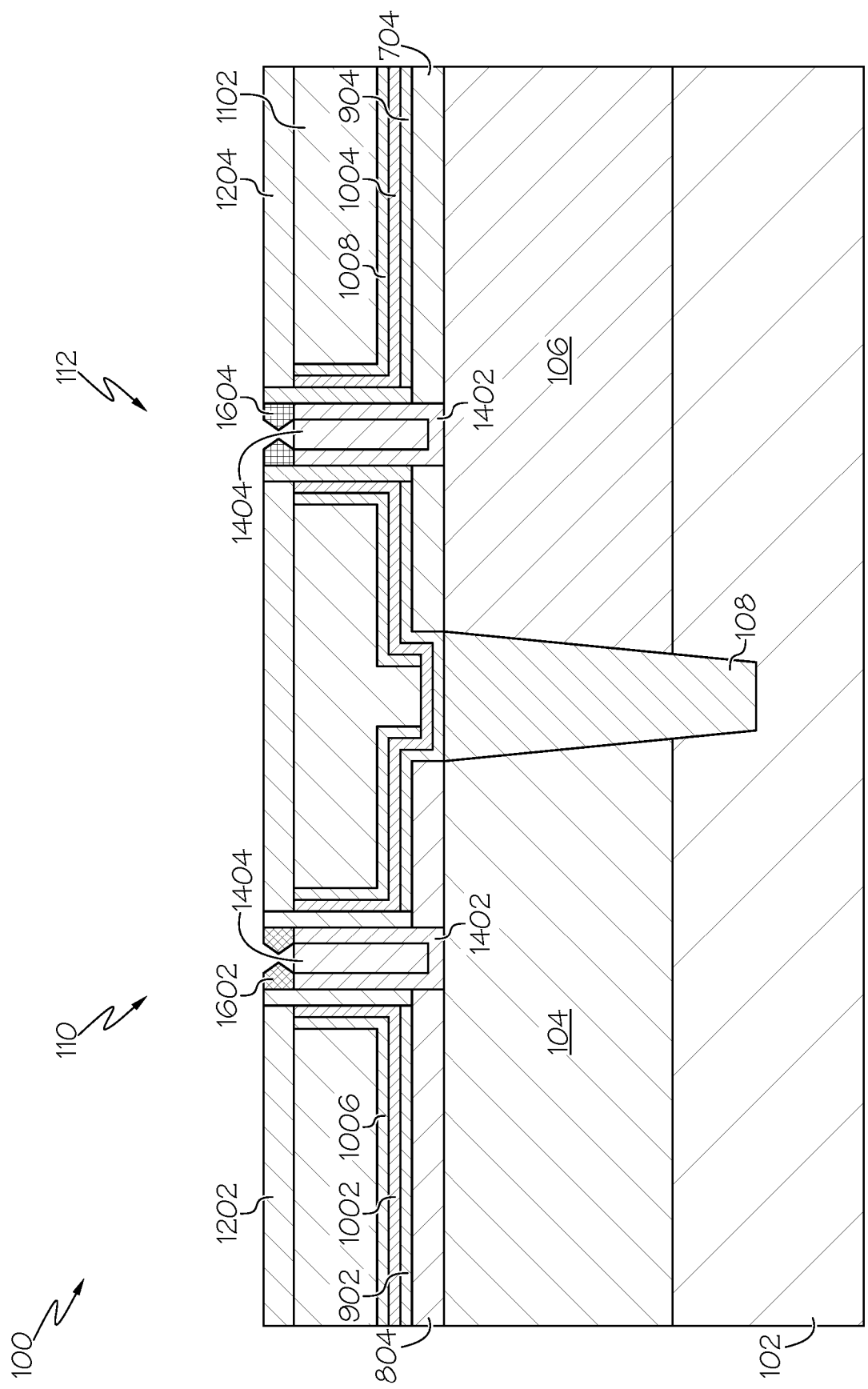
FIG. 16 is a cross-sectional view of the semiconductor structure after top source drain layers have been formed in the NFET and PFET areas of the semiconductor structure according one embodiment of the present disclosure.

Top source/drains 1602, 1604 are then formed, as shown in FIG. 16. In one embodiment, each top source/drain 1602, 1604 extends laterally inward from the portion of the inner sidewalls of its respective NFET and PFET epitaxial channel structure 404, 304 exposed within the trenches 1302, 1304. The source/drains 1602, 1604 may be formed using a selective epitaxy process. The growth rates may be engineered so that during the epitaxial growth faceted top source/drains 1602, 1604 are obtained. As shown in FIG. 16, the drains 1602, 1604 comprise angled sides that angle toward the center of the trenches 1302, 1304. The source/drains 1602, 1604 may comprise in-situ doping (boron, in one embodiment for PFET and phosphorus, in one embodiment, for NFET). It other embodiments, the source/drains 1602, 1604 may not contain any doping. Doping may be performed using any standard approach such as ion implantation. The source/drain 1602 could be Si doped InAs or similar for an NFET type semiconductor and source/drain 1604 may be P type doped Si, SiGe, or Ge for a PFET type semiconductor.

Figure 17:
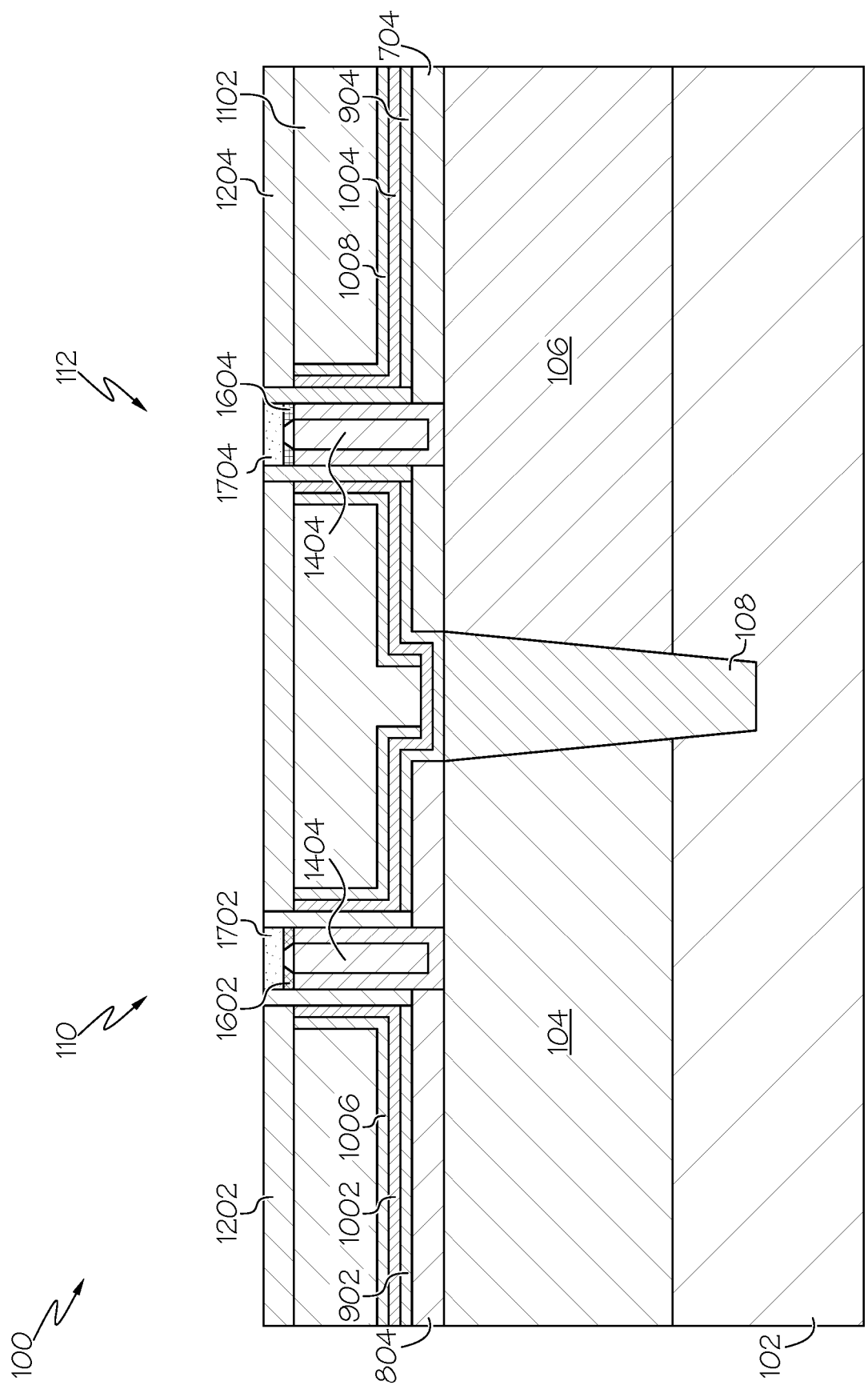
FIG. 17 is a cross-sectional view of the semiconductor structure after silicide regions have been formed in the top source drain layers according one embodiment of the present disclosure.

Silicide regions 1702, 1704 are then formed on the exposed portions of the top source/drain layers 1602, 1604, as shown in FIG. 17. For example, a metal is deposited on top and in contact with the exposed portions of the top source/drain layers 1602, 1604. An anneal is then performed to form silicides from the deposited metal and a portion of the top source/drain layers 1602, 1604. Unreacted metal is then selectively removed. The metal, in one example, includes cobalt, tungsten, nickel, titanium, platinum, or an alloy or combination thereof. However, other materials are applicable a well. The silicide regions 1702, 1704 improve source/drain resistance. Additional fabrication processes such as MOL and contact fabrication process may be performed to complete the device.

Figure 18:
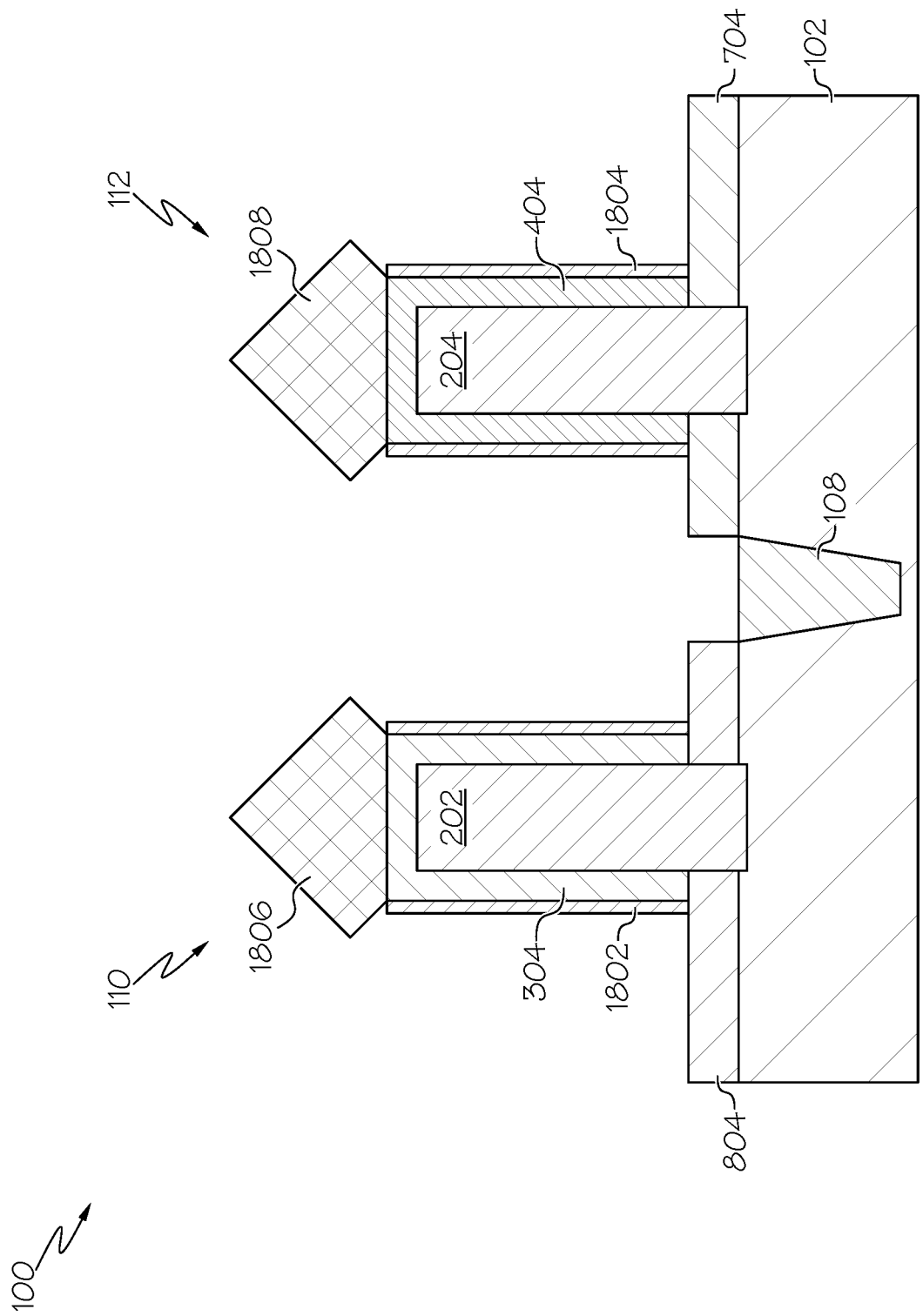
FIG. 18 is a cross-sectional view of the semiconductor structure illustrating one additional embodiment for forming the bottom source/drain layers where a top epitaxial layer is formed as a result of forming the bottom source/drain layers according one embodiment of the present disclosure.
Figure 19:
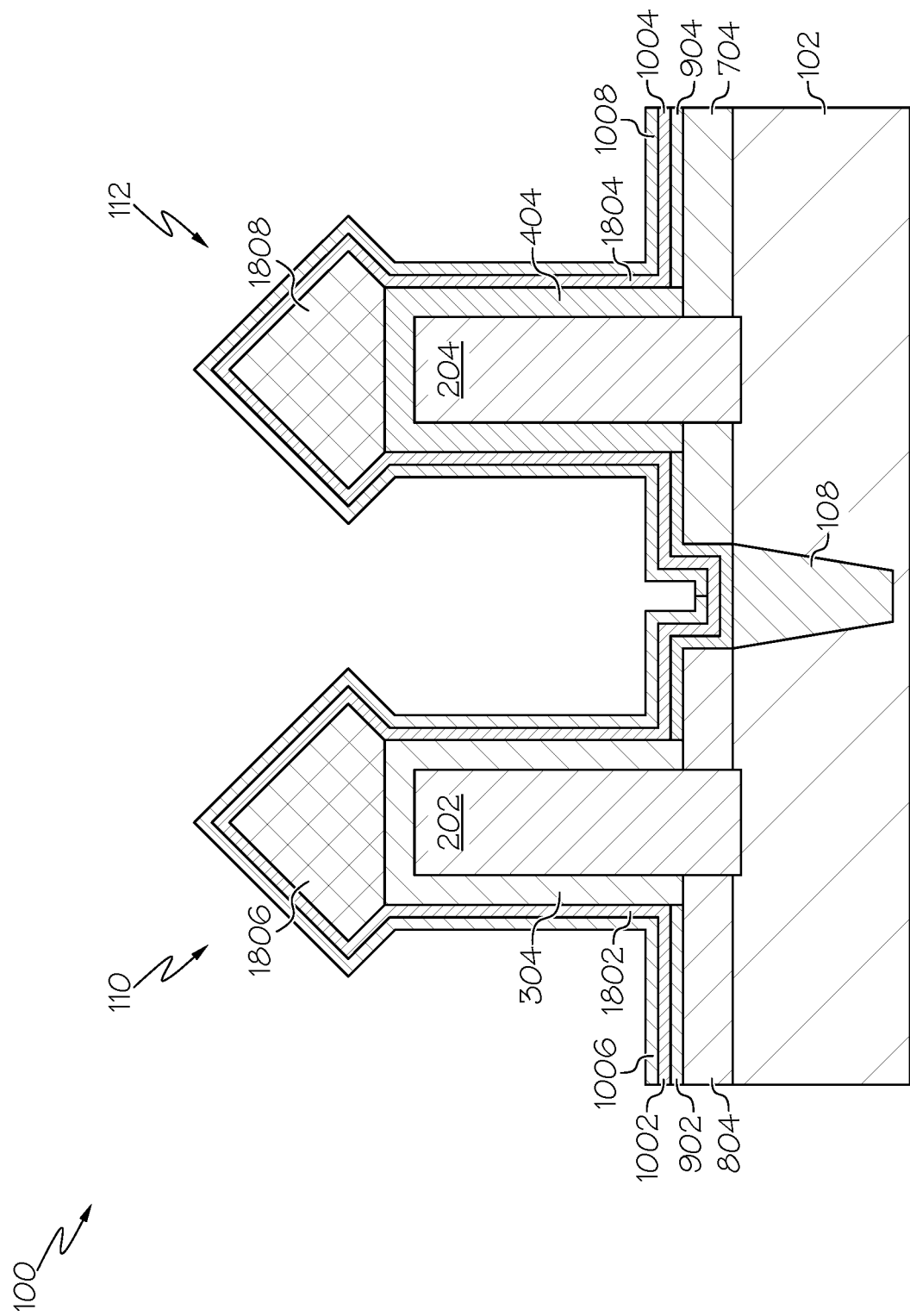
FIG. 19 is a cross-sectional view of the semiconductor structure after gate structures have been formed over the top epitaxial layers of FIG. 18 according one embodiment of the present disclosure.

Referring to FIG. 18, the bottom source/drain layers 704, 804 discussed above with respect to FIGS. 7 and 8 may be formed using one or more alternative process flows. For example, after the NFET and PFET epitaxial channel structures 404, 304 are formed sacrificial layers 1802, 1804 such as silicon nitride layers are formed on sidewalls of the epitaxial channel structures 304, 404. The insulating layer 114 is then removed as discussed above and the bottom source/drain layers 704, 804 are formed. This process also forms faceted epi layers 1806, 1808 on the top surface of the epitaxial channel structures 304, 404. The sacrificial layers 1802, 1804 are removed and the bottom spacer 902, 904; dielectric layer 1002, 1004; and metal gates 1006, 1008, are then formed as discussed above, as shown in FIG. 19. However, the dielectric layer 1002, 1004 and metal gates 1006, 1008 are also formed on the faceted epi layers 1806, 1808 on the top surface of the epitaxial channel structures 304, 404. The oxide layer 1102 is then formed and recessed similar to FIG. 11. A polishing/recess process(es) is then performed to remove the faceted epi layers 1802, 1804 and recess the dielectric and metal gate layers 1002 to 1006 resulting in a structure similar to that shown in FIG. 11. The top spacer layer 120, 1204 may then be formed as discussed above with respect to FIG. 12.

Figure 20:
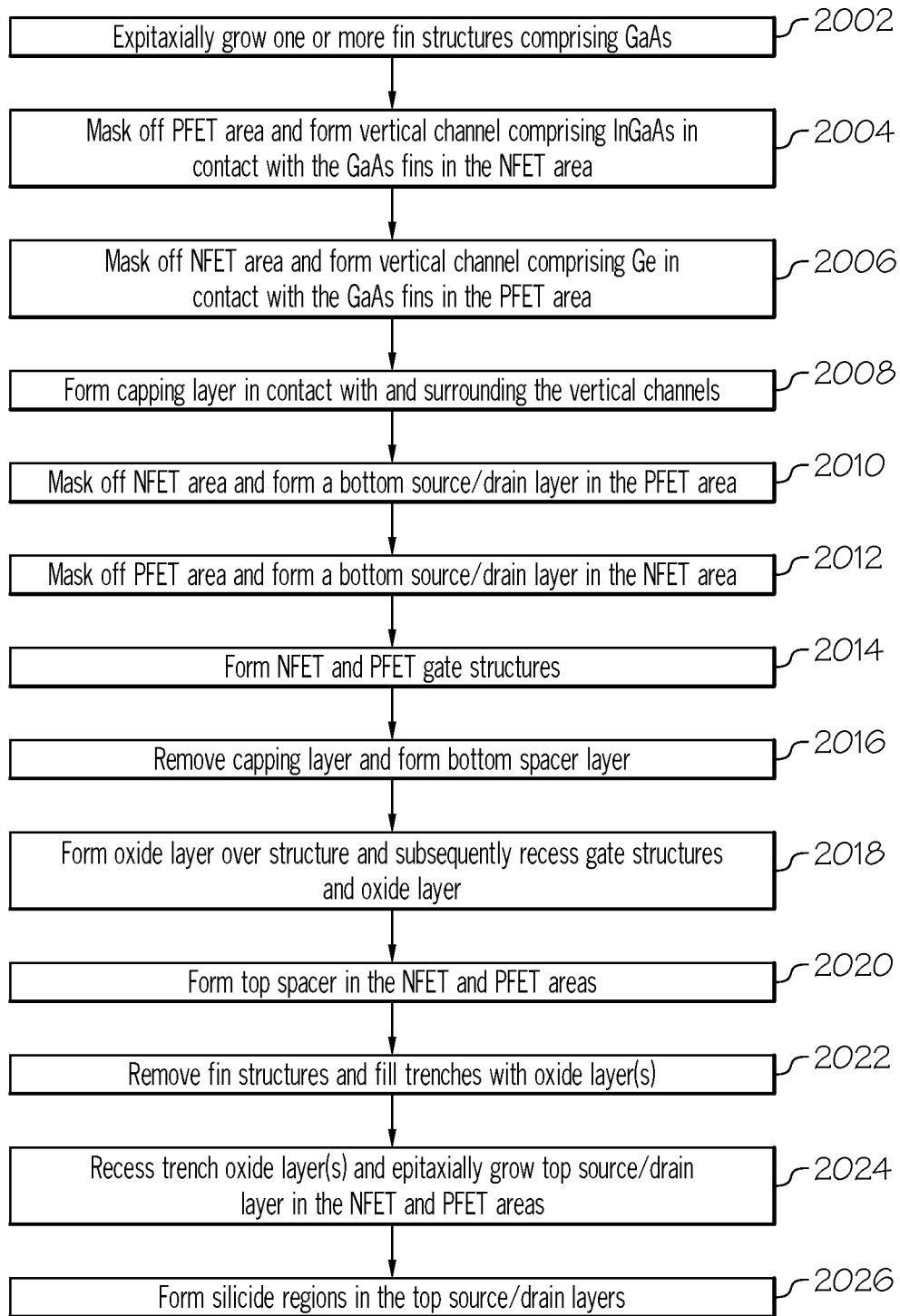
FIG. 20 is an operational flow diagram illustrating one example of a process for forming a semiconductor structure having devices having freestanding vertical III-V/Ge nanowires on silicon without any buffering according one embodiment of the present disclosure.

FIG. 20 is an operational flow diagram illustrating one example of a process for forming a semiconductor structure having devices having freestanding vertical III-V/Ge nanowires on silicon without any buffering according one embodiment of the present disclosure. It should be noted that each of the steps shown in FIG. 20 have been discussed in greater detail above with respect to FIGS. 1 to 19. One or more fin structures, at step 2002, comprising GaAs are epitaxially grown in contact with a portion of a substrate. A PFET area of the structure, at step 2004, is masked off and a vertical channel comprising InGaAs is formed in contact with the GaAs fins in the NFET area. The NFET area of the structure, at step 2006, is masked off and a vertical channel comprising Ge is formed in contact with the GaAs fins in the PFET area.

A capping layer, at step 2008, is formed in contact with and surrounding the vertical channels. The NFET area, at step 2010 is masked off and a bottom source/drain layer is formed in the PFET area. The PFET area, step 2012 is masked off a bottom source/drain layer is formed in the PFET area. The capping layers, at step 2014, are removed and a bottom spacer layer is formed in the NFET and PFET areas. NFET and PFET gate structures, at step 2016, are formed. An oxide layer, at step 2018, is formed over the structure, wherein the gate structures and oxide layer are subsequently recessed.

A top spacer layer, at step 2020, is then formed in the NFET and PFET areas. The fin structures in the NFET and PFET areas, at step 2022, are removed and the resulting trenches are filed with one or more oxide layers. The oxide layers, at step 2024, are recessed and top source/drain layers are epitaxially grown from the exposed inner sidewalls of the vertical channels in the NFET and PFET areas. Silicide regions, at step 2026, are then formed in the top source/drain layers. Additional fabrication processes may then be performed to complete the NFET and PFET devices.

Although specific embodiments have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also note that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A semiconductor structure comprising at least:
   a substrate;
   a first source/drain layer in contact with at least the substrate;
   a vertical channel comprising one of indium gallium arsenide or germanium in contact with at least the first/source drain layer, wherein the vertical channel is formed above the first source/drain layer and surrounds one or more oxide layers;
   a gate structure in contact with at least the vertical channel; and
   a second source/drain layer in contact with at least inner sidewalls of the vertical channel.

2. The semiconductor structure of claim 1, wherein the substrate comprises silicon.

3. The semiconductor structure of claim 1, further comprising:
   a first spacer layer in contact with at least the first source/drain layer and the vertical channel; and
   a second spacer layer in contact with the gate structure and the second source/drain layer.

4. The semiconductor structure of claim 3, wherein the gate structure comprises a dielectric layer in contact with the vertical channel, the first spacer layer, and the second spacer layer, and wherein the gate structure further comprises a metal layer in contact with the dielectric layer and the second spacer.

5. The semiconductor structure of claim 1, further comprising:
   a silicide region in contact with the second source/drain layer.

6. The semiconductor structure of claim 1, wherein the first source/drain layer comprises silicon doped indium arsenide.

7. A semiconductor structure comprising at least:
   a substrate;
   a first source/drain layer in contact with at least the substrate;
   a vertical channel comprising germanium in contact with at least the first source/drain layer, the vertical channel surrounding one or more oxide layers;
   a gate structure in contact with at least the vertical channel; and
   a second source/drain layer in contact with at least inner sidewalls of the vertical channel.

8. The semiconductor structure of claim 7, wherein the substrate comprising silicon.

9. The semiconductor structure of claim 7, further comprising:
   a first spacer layer in contact with at least the first source/drain layer and the vertical channel; and
   a second spacer layer in contact with the gate structure and the second source/drain layer.

10. The semiconductor structure of claim 9, wherein the gate structure comprises a dielectric layer in contact with the vertical channel, the first spacer layer, and the second spacer layer, and wherein the gate structure further comprises a metal layer in contact with the dielectric layer and the second spacer.

11. The semiconductor structure of claim 7, further comprising:
   a silicide region in contact with the second source/drain layer.

12. The semiconductor structure of claim 7, wherein the one or more oxide layers comprise at least one of:
Al2O3;
HfO2;
ZrO2;
SiO2;
GeO2;
Si rich GeO2;
Si/GeO2;
SiO2/GeO2; and
Si/SiO2.

13. The semiconductor structure of claim 7, wherein the first source/drain layer comprises boron doped germanium.

14. A method for forming a semiconductor structure, the method comprising:
    forming, for one or more fin structures each comprising gallium arsenide, a channel layer comprising indium gallium arsenide or germanium in contact with the fin structure and an insulating layer;
    forming, for the one or more fin structures, a sacrificial layer in contact with sidewalls of the channel layer and the insulating layer;
    removing, for each of the one or more fin structures, at least a portion of the insulating layer; and
    forming, for each of the one or more fin structures, a bottom source/drain layer in place of the insulating layer.

15. The method of claim 14, wherein forming the bottom source/drain layer further forms a faceted epitaxial layer in contact with a top surface of the channel layer.

16. The method of claim 15, further comprising:
    removing, for each of the one or more fin structures, the sacrificial layer; and
    forming, for each of the one or more fin structures, a spacer layer in contact with the bottom source/drain layer and the channel layer.

17. The method of claim 16, further comprising:
    forming, for each of the one or more fin structures, a gate dielectric layer in contact with the faceted epitaxial layer, the channel layer, and the spacer layer; and
    forming, for each of the one or more fin structures, a gate metal layer in contact with the gate dielectric layer.

18. The method of claim 17, further comprising:
    depositing an oxide layer; and
    recessing the oxide layer below a top surface of the one or more fin structures.

19. The method of claim 18, further comprising:
    etching, for each of the one or more fin structures, the gate dielectric layer and the gate metal layer down below the top surface of the fin structure;
    removing, for each of the one or more fin structures, the faceted epitaxial layer; and
    forming an additional spacer in contact with at least a top surface of the oxide layer, a top surface of the gate dielectric layer, and a top surface of the gate metal layer.

* * * * *